(12) United States Patent
Curran et al.

(10) Patent No.: US 11,312,107 B2
(45) Date of Patent: Apr. 26, 2022

(54) PLUGGING ANODIC OXIDES FOR INCREASED CORROSION RESISTANCE

(71) Applicant: Apple Inc., Cupertino, CA (US)

(72) Inventors: James A. Curran, Morgan Hill, CA (US); Hoishun Li, San Jose, CA (US); Nathaniel A. Dixon, Redwood City, CA (US)

(73) Assignee: Apple Inc., Cupertino, CA (US)

( * ) Notice: Subject to any disclaimer, the term of this patent is extended or adjusted under 35 U.S.C. 154(b) by 405 days.

(21) Appl. No.: 16/256,825

(22) Filed: Jan. 24, 2019

(65) Prior Publication Data

US 2020/0101696 A1  Apr. 2, 2020

Related U.S. Application Data

(60) Provisional application No. 62/737,687, filed on Sep. 27, 2018.

(51) Int. Cl.
*B32B 3/30* (2006.01)
*B32B 5/14* (2006.01)
(Continued)

(52) U.S. Cl.
CPC .............. *B32B 15/043* (2013.01); *B32B 3/30* (2013.01); *B32B 15/04* (2013.01); *B32B 15/20* (2013.01); *C25D 11/02* (2013.01); *C25D 11/14* (2013.01); *C25D 11/18* (2013.01); *H05K 5/04* (2013.01); *B32B 5/145* (2013.01); *B32B 5/147* (2013.01); *B32B 33/00* (2013.01); *B32B 2307/20* (2013.01); *B32B 2307/40* (2013.01); *B32B 2307/402* (2013.01); *B32B 2307/714* (2013.01); *B32B 2307/7265* (2013.01);
(Continued)

(58) Field of Classification Search
None
See application file for complete search history.

(56) References Cited

U.S. PATENT DOCUMENTS 3,016,293 A * 1/1962 Cybriwsky ............ C25D 11/18
8/485
3,218,243 A * 11/1965 Michelson ............. C25D 11/18
205/202

(Continued)

FOREIGN PATENT DOCUMENTS

AT    262714 B  *  6/1968
CN   1066691 A  * 12/1992 ............ C25D 11/18
(Continued)

OTHER PUBLICATIONS

Machine Translation of AT262714B, Jun. 1968 (Year: 1968).*

(Continued)

*Primary Examiner* — Jeffrey A Vonch
(74) *Attorney, Agent, or Firm* — Dorsey & Whitney LLP

(57) ABSTRACT

This application relates to an enclosure for a portable electronic device. The enclosure includes a metal substrate and a dehydrated anodized layer overlaying the metal substrate. The dehydrated anodized layer includes pores having openings that extend from an external surface of the dehydrated anodized layer and towards the metal substrate, and a metal oxide material that plugs the openings of the pores, where a concentration of the metal oxide material is between about 3 wt % to about 10 wt %.

15 Claims, 12 Drawing Sheets

(51) Int. Cl.
  *B32B 15/04* (2006.01)
  *B32B 15/20* (2006.01)
  *C25D 11/18* (2006.01)
  *H05K 5/04* (2006.01)
  *H05K 5/02* (2006.01)
  *C25D 11/14* (2006.01)
  *C25D 11/02* (2006.01)
  *C25D 11/16* (2006.01)
  *C25D 11/24* (2006.01)
  *B32B 33/00* (2006.01)

(52) U.S. Cl.
  CPC ..... *B32B 2307/752* (2013.01); *B32B 2311/24* (2013.01); *B32B 2457/00* (2013.01); *C25D 11/16* (2013.01); *C25D 11/243* (2013.01); *H05K 5/0243* (2013.01); *Y10T 428/24273* (2015.01); *Y10T 428/24331* (2015.01); *Y10T 428/24339* (2015.01); *Y10T 428/24942* (2015.01); *Y10T 428/249956* (2015.04)

(56) References Cited

U.S. PATENT DOCUMENTS

| | | | | |
|---|---|---|---|---|
| 3,406,106 A * | 10/1968 | Garwood | C25D 11/18 | 205/203 |
| 3,440,150 A * | 4/1969 | Burrows | C25D 11/18 | 205/50 |
| 3,450,606 A * | 6/1969 | Darrow | C25D 11/12 | 205/121 |
| 3,488,262 A * | 1/1970 | Forestek | C25D 11/18 | 205/224 |
| 3,964,982 A * | 6/1976 | Kim | G01N 17/02 | 205/81 |
| 4,066,816 A * | 1/1978 | Sheasby | C25D 11/12 | 428/336 |
| 4,225,398 A * | 9/1980 | Hasegawa | B05D 7/14 | 205/201 |
| 4,288,299 A * | 9/1981 | Carter | C25D 11/246 | 205/173 |
| 4,756,771 A * | 7/1988 | Brodalla | C25D 11/246 | 148/244 |
| 5,250,173 A * | 10/1993 | Jozefowicz | C25D 11/22 | 205/121 |
| 5,786,835 A * | 7/1998 | Ikeda | B41M 5/0047 | 347/106 |
| 7,122,107 B2 | 10/2006 | Kia et al. | | |
| 7,931,939 B2 | 4/2011 | Yamaguchi | | |
| 2003/0035970 A1* | 2/2003 | Wada | C25D 11/18 | 428/472.2 |
| 2003/0087071 A1* | 5/2003 | Hsu | C25D 11/04 | 428/209 |
| 2004/0151926 A1* | 8/2004 | Wada | C25D 11/04 | 428/472 |
| 2005/0029115 A1* | 2/2005 | Kuo | C25D 11/12 | 205/328 |
| 2005/0045487 A1* | 3/2005 | Kia | C25D 5/50 | 205/224 |
| 2006/0103286 A1 | 5/2006 | Lambertini et al. | | |
| 2008/0032121 A1* | 2/2008 | Lawlor | C25D 11/24 | 428/335 |
| 2008/0081173 A1* | 4/2008 | Hatanaka | C25D 11/20 | 428/304.4 |
| 2008/0105203 A1* | 5/2008 | Mitsuhashi | C23C 16/4404 | 118/723 R |
| 2008/0152941 A1* | 6/2008 | Hatanaka | H01L 21/02258 | 428/613 |
| 2008/0164151 A1* | 7/2008 | Ohmi | C25D 11/18 | 205/324 |
| 2008/0311362 A1* | 12/2008 | Binder | B05D 1/18 | 428/210 |
| 2009/0038946 A1* | 2/2009 | Ohmi | C25D 11/18 | 205/95 |
| 2009/0061216 A1 | 3/2009 | Levendusky et al. | | |
| 2009/0239065 A1* | 9/2009 | Jennings | C09D 5/18 | 428/336 |
| 2010/0183869 A1* | 7/2010 | Lin | B22D 17/20 | 428/332 |
| 2011/0284381 A1* | 11/2011 | Cabot | C25D 11/24 | 205/50 |
| 2011/0284383 A1* | 11/2011 | Cabot | C23C 28/04 | 205/50 |
| 2012/0015172 A1* | 1/2012 | Gao | C25D 11/243 | 428/304.4 |
| 2012/0196058 A1* | 8/2012 | Kleinert | C25D 11/243 | 428/34.1 |
| 2012/0244280 A1* | 9/2012 | Hecht | C25D 11/246 | 427/239 |
| 2012/0256224 A1* | 10/2012 | Hatanaka | C25D 11/04 | 257/98 |
| 2012/0318674 A1* | 12/2012 | Wada | C25D 11/18 | 205/108 |
| 2013/0093299 A1* | 4/2013 | Cho | C25D 11/246 | 312/223.1 |
| 2013/0153428 A1* | 6/2013 | Akana | C25D 11/30 | 205/50 |
| 2013/0224406 A1* | 8/2013 | Chang | C25D 11/16 | 428/34.1 |
| 2013/0263428 A1* | 10/2013 | Tsou | C25F 3/18 | 29/460 |
| 2013/0318766 A1 | 12/2013 | Kiple et al. | | |
| 2014/0001052 A1* | 1/2014 | Maloney | C25D 11/243 | 205/196 |
| 2014/0083861 A1* | 3/2014 | Askin | C25D 11/24 | 205/202 |
| 2014/0116883 A1* | 5/2014 | Xiong | C25D 11/246 | 205/50 |
| 2014/0117840 A1* | 5/2014 | Hatanaka | H05K 1/0274 | 313/498 |
| 2014/0166490 A1* | 6/2014 | Tatebe | C25D 11/22 | 205/50 |
| 2014/0190739 A1* | 7/2014 | Zhou | C25D 11/246 | 174/565 |
| 2014/0209467 A1* | 7/2014 | Miao | C25D 11/14 | 205/50 |
| 2014/0346049 A1* | 11/2014 | Khosla | C25D 11/022 | 205/50 |
| 2015/0034487 A1* | 2/2015 | Danzebrink | C23C 18/1254 | 205/50 |
| 2015/0064450 A1 | 3/2015 | Sun et al. | | |
| 2015/0090597 A1 | 4/2015 | Tatebe et al. | | |
| 2015/0090598 A1* | 4/2015 | Tatebe | C25D 11/12 | 205/50 |
| 2015/0368822 A1* | 12/2015 | Sammelselg | C25D 11/06 | 428/312.8 |
| 2015/0368823 A1* | 12/2015 | Curran | C25D 11/22 | 205/50 |
| 2016/0089834 A1 | 3/2016 | Mag et al. | | |
| 2016/0251771 A1 | 9/2016 | Lawless et al. | | |
| 2016/0273123 A1* | 9/2016 | Yu | C25D 11/06 | |
| 2016/0362808 A1* | 12/2016 | Yamamoto | C25D 11/22 | |
| 2017/0016136 A1* | 1/2017 | Yamamoto | C25D 11/22 | |
| 2017/0044684 A1 | 2/2017 | Tatebe et al. | | |
| 2017/0051425 A1 | 2/2017 | Curran et al. | | |
| 2017/0051426 A1 | 2/2017 | Curran et al. | | |
| 2017/0088917 A1 | 3/2017 | Curran et al. | | |
| 2017/0107628 A1* | 4/2017 | Trinidad | C23C 18/54 | |
| 2017/0121836 A1 | 5/2017 | Tatebe et al. | | |
| 2017/0121837 A1* | 5/2017 | Tatebe | C25D 11/08 | |
| 2017/0121838 A1* | 5/2017 | Tatebe | H05K 5/0243 | |
| 2017/0347476 A1* | 11/2017 | Hwang | C25D 11/022 | |
| 2017/0356097 A1 | 12/2017 | Eagerton | | |
| 2017/0358430 A1* | 12/2017 | Chiu | H01J 37/32495 | |
| 2018/0023210 A1 | 1/2018 | Akimoto et al. | | |
| 2018/0080138 A1* | 3/2018 | Curran | C25D 11/246 | |
| 2018/0084658 A1* | 3/2018 | Curran | C23C 14/5886 | |
| 2018/0282879 A1* | 10/2018 | Opalka | C23F 11/06 | |
| 2018/0327926 A1* | 11/2018 | van Hassel | C23C 28/048 | |
| 2019/0032237 A1* | 1/2019 | Kim | C25D 13/12 | |
| 2019/0062939 A1* | 2/2019 | Curran | C25D 11/246 | |

(56) References Cited

U.S. PATENT DOCUMENTS

| | | | | |
|---|---|---|---|---|
| 2019/0330755 | A1* | 10/2019 | Liao | C25D 11/08 |
| 2019/0338436 | A1* | 11/2019 | Liao | C25D 11/243 |
| 2019/0382911 | A1* | 12/2019 | Curran | C25D 11/34 |
| 2020/0383224 | A1* | 12/2020 | Curran | C25D 11/20 |
| 2021/0054469 | A1* | 2/2021 | Jeon | C25D 11/24 |
| 2021/0130974 | A1* | 5/2021 | Kim | C23C 28/04 |

FOREIGN PATENT DOCUMENTS

| | | | | |
|---|---|---|---|---|
| CN | 1756861 | A | | 4/2006 |
| CN | 101275264 | A | | 10/2008 |
| CN | 101809207 | A | | 8/2010 |
| CN | 101812713 | A | | 8/2010 |
| CN | 102036814 | A | | 4/2011 |
| CN | 102958691 | A | | 3/2013 |
| CN | 102834551 | B | | 7/2015 |
| CN | 105297104 | A | * | 2/2016 |
| CN | 105492662 | A | | 4/2016 |
| CN | 105492663 | A | | 4/2016 |
| CN | 105506706 | A | * | 4/2016 |
| CN | 105937046 | A | * | 9/2016 |
| CN | 107257868 | A | | 10/2017 |
| CN | 107385493 | A | | 11/2017 |
| CN | 107653470 | A | | 2/2018 |
| CN | 107923062 | A | | 4/2018 |
| CN | 108350598 | A | | 7/2018 |
| DE | 102007057777 | A1 | * | 6/2009 ........... C25D 11/246 |
| EP | 0358338 | A2 | * | 3/1990 ........... C23C 22/34 |
| EP | 1486588 | A2 | * | 12/2004 ........... C25D 11/246 |
| GB | 595365 | A | * | 12/1947 ........... C22F 1/008 |
| GB | 1557281 | A | * | 12/1979 ........... F24S 70/25 |
| JP | 49008429 | A | * | 1/1974 |
| JP | 54066463 | A | * | 5/1979 ........... C23C 22/34 |
| JP | 63161192 | A | * | 7/1988 |
| JP | 01225793 | A | * | 9/1989 ........... C25D 11/18 |
| JP | 04141600 | A | * | 5/1992 |
| JP | 04218694 | A | * | 8/1992 |
| JP | 06316787 | A | * | 11/1994 ........... C25D 11/18 |
| JP | 07180091 | A | * | 7/1995 |
| JP | 07216588 | A | * | 8/1995 |
| JP | 07238631 | A | * | 9/1995 |
| JP | 08134694 | A | * | 5/1996 ........... C25D 11/18 |
| JP | 09087890 | A | * | 3/1997 |
| JP | 10130884 | A | * | 5/1998 |
| JP | 11012762 | A | * | 1/1999 ........... C23C 28/00 |
| JP | 11181596 | A | * | 7/1999 |
| JP | H11181596 | A | | 7/1999 |
| JP | 11229185 | A | * | 8/1999 |
| JP | 2000212797 | A | * | 8/2000 |
| JP | 2002129386 | A | * | 5/2002 |
| JP | 2003277990 | A | * | 10/2003 |
| JP | 2004060044 | A | * | 2/2004 |
| JP | 2005029891 | A | * | 2/2005 |
| JP | 2005105300 | A | * | 4/2005 |
| JP | 2006097117 | A | * | 4/2006 |
| JP | 2007186753 | A | * | 7/2007 |
| JP | 2007254784 | A | * | 10/2007 |
| JP | 2009155714 | A | * | 7/2009 |
| JP | 2010018890 | A | * | 1/2010 |
| JP | 2010215945 | A | * | 9/2010 |
| JP | 2014136832 | A | * | 7/2014 ........... C25D 11/246 |
| JP | 2015017327 | A | * | 1/2015 |
| JP | 2016194098 | A | * | 11/2016 |
| JP | 2017122271 | A | * | 7/2017 |
| JP | 2017186638 | A | * | 10/2017 |
| JP | 20180908987 | A | | 6/2018 |
| KR | 20090123615 | A | * | 12/2009 |
| KR | 20100089197 | A | * | 8/2010 |
| KR | 20130115475 | A | * | 10/2013 |
| WO | WO-9705302 | A1 | * | 2/1997 ........... C25D 11/18 |
| WO | WO-0118281 | A1 | * | 3/2001 ........... C25D 11/22 |
| WO | WO-2009072546 | A1 | * | 6/2009 ........... C25D 11/246 |
| WO | 2009117379 | A1 | | 9/2009 |
| WO | 2011146397 | A1 | | 11/2011 |
| WO | 2012119306 | A1 | | 9/2012 |
| WO | WO-2015003798 | A1 | * | 1/2015 ........... C25D 11/243 |
| WO | 2017074877 | A2 | | 5/2017 |
| WO | 2018145780 | A1 | | 8/2018 |
| WO | WO-2018139749 | A1 | * | 8/2018 ........... C23C 28/44 |
| WO | WO-2019123741 | A1 | * | 6/2019 ........... C25D 11/06 |

OTHER PUBLICATIONS

Alwitt, The Growth of Hydrous Oxide Films on Aluminum, 1974, Journal of The Electrochemical Society, vol. 121 (Year: 1974).*

Machine Translation of JP11229185A, Aug. 1999 (Year: 1999).*

Hao et al., Sealing processes of anodic coatings—Past, present, and future, Dec. 2000, Metal Finishing, vol. 98, Issue 12, pp. 8-18 (Year: 2000).*

González et al., Postsealing Changes in Porous Aluminum Oxide Films Obtained in Sulfuric Acid Solutions, 2000, Journal of The Electrochemical Society, vol. 147, No. 3 (Year: 2000).*

Krokidis et al., Theoretical Study of the Dehydration Process of Boehmite to γ-Alumina, May 2001, J. Phys. Chem. B, vol. 105, No. 22, pp. 5121-5130 (Year: 2001).*

Ventura et al., Sealing Method for Anodizing Aluminium and Hard Anodizing and Test For Seal Quality of Aluminium, 2004 (Year: 2004).*

López et al., Comparison by SEM, TEM, and EIS of Hydrothermally Sealed and Cold Sealed Aluminum Anodic Oxides, Jan. 2006, Journal of The Electrochemical Society, vol. 153, No. 3 (Year: 2006).*

Bartolomé et al., Changes in the specific surface area of porous aluminium oxide films during sealing, Apr. 2006, Surface and Coatings Technology, vol. 200, Issues 14-15, pp. 4530-4537 (Year: 2006).*

Machine Translation of DE102007057777A1, Jun. 2009 (Year: 2009).*

Machine Translation of KR20100089197A, Aug. 2010 (Year: 2010).*

Ono et al., Sealing Mechanism of Anodic Porous Oxide Films Formed on Aluminum in Lithium Hydroxide Solution, Sep. 2010, Proceedings of the 12th International Conference on Aluminum Alloys, (Year: 2010).*

Takahashi et al., Anodic Oxide Films on Aluminum: Their Significance for Corrosion Protection and Micro- and Nano-Technologies, Jan. 2010, Modern Aspects of Series Editors: Electrochemistry, No. 46: Progress in Corrosion Science and Engineering I (Year: 2010).*

Liu et al., Abstract for "Study on corrosion resistance properties of hydrothermal sealed arc sprayed aluminium coating", Aug. 2010, Surface Engineering, vol. 26, No. 6 (Year: 2010).*

Zhou et al., Abstract for "Influence of Technological Parameter on Boehmite Sol Sealing Anodized Al 2024 Alloy", Sep. 2011, Advanced Materials Research, vol. 337, pp. 77-80 (Year: 2011).*

Franco et al., Porous Layer Characterization of Anodized and Black-Anodized Aluminium by Electrochemical Studies, Dec. 2012, International Scholarly Research Notices, vol. 2012 (Year: 2012).*

Hakimizad et al., A comparative study of corrosion performance of sealed anodized layers of conventionally colored and interference-colored aluminium, Jun. 2012, Surface and Coatings Technology, vol. 206, Issue 22, pp. 4628-4633 (Year: 2012).*

Lee et al., Effects of residual water in the pores of aluminum anodic oxide layers prior to sealing on corrosion resistance, Oct. 2013, Applied Surface Science, vol. 283, pp. 941-946 (Year: 2013).*

Machine Translation of JP2014136832A, Jul. 2014 (Year: 2014).*

Lee et al., Cr2O3 sealing of anodized aluminum alloy by heat treatment, Mar. 2014, Surface and Coatings Technology, vol. 243, pp. 34-38 (Year: 2014).*

Liu et al., Abstract for "Preparation and Effect of Heat Treatment Temperature on the Crystal Phase of Anodic Aluminum Oxide Films" Jul. 2014, Applied Mechanics and Materials, vol. 577 (Year: 2014).*

Machine Translation of CN105297104A, Feb. 2016 (Year: 2016).*

Machine Translation of CN105937046A, Sep. 2016 (Year: 2016).*

Hu et al., Effect of sealing on the morphology of anodized aluminum oxide, Aug. 2016, Corrosion Science, vol. 97, pp. 17-24 (Year: 2016).*

(56) References Cited

OTHER PUBLICATIONS

Wu et al., Novel anodic oxide film with selfsealing layer showing excellent corrosion resistance, May 2017, Scientific Reports, vol. 7 (Year: 2017).*

Abdel-Salam et al., "Characterization of the hard anodizing layers formed on 2014-T3 Al alloy, in sulphuric acid electrolyte containing sodium lignin sulphonate," Egyptian Journal of Petroleum, Aug. 9, 2017 <https://doi.org/10.1016/j.ejpe.2017.07.014>, 8 pages.

* cited by examiner

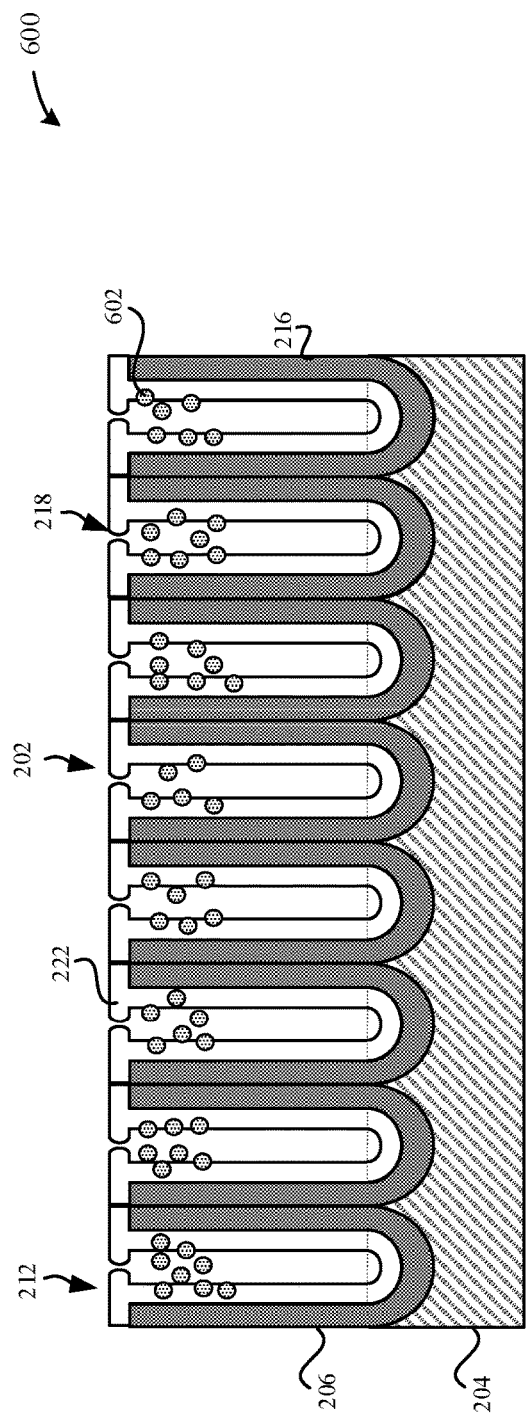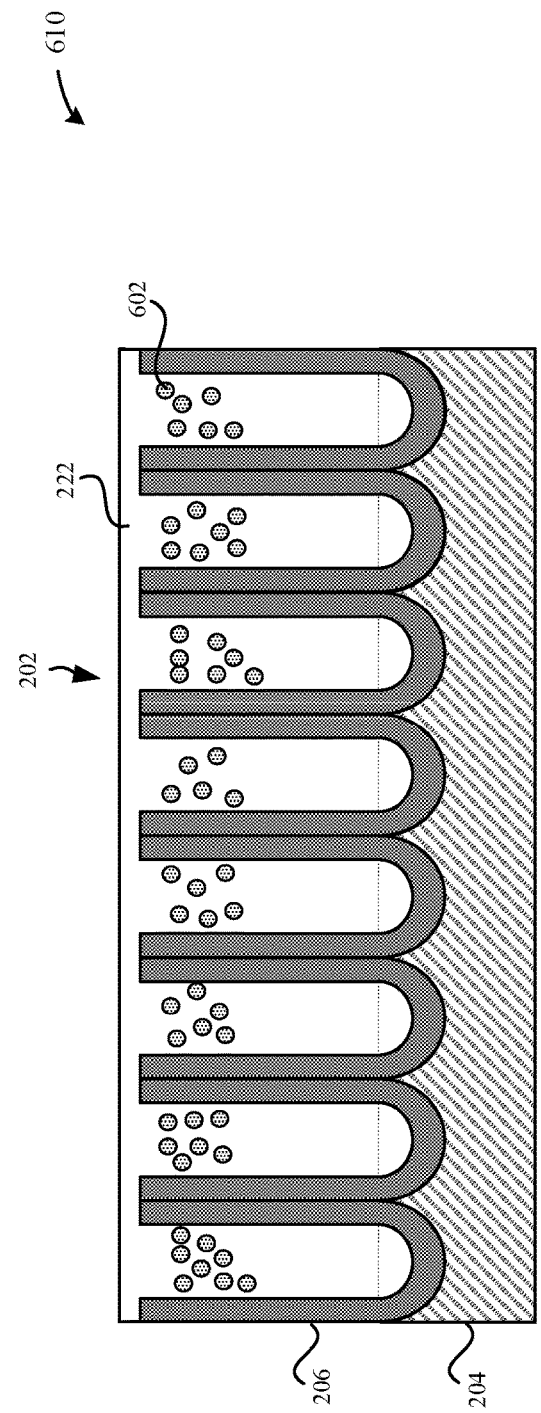
FIG. 6A
FIG. 6B

PLUGGING ANODIC OXIDES FOR INCREASED CORROSION RESISTANCE

CROSS-REFERENCE TO RELATED APPLICATIONS

The present application claims the benefit of U.S. Provisional Application No. 62/737,687, entitled "PLUGGING ANODIC OXIDES FOR INCREASED CORROSION RESISTANCE," filed Sep. 27, 2018, the content of which is incorporated herein by reference in its entirety for all purposes.

FIELD

The described embodiments relate generally to enclosures for portable electronic devices that include metal oxide layers. More particularly, the described embodiments relate to metal oxide layers having dehydrated plugs that impart these enclosures with increased corrosion resistance.

BACKGROUND

Enclosures for portable electronic devices can include an anodized layer that imparts these enclosures with an aesthetically pleasing appearance. Furthermore, pores of the anodized layer can be sealed such as to impart these enclosures with corrosion protection when these enclosures are exposed to external elements (e.g., moisture, salt, chemicals, debris, etc.). However, over time, these seals are susceptible to dissolving when the anodized layer is exposed to these external elements. Consequently, the metal substrate underlying the anodized layer may become corroded, thereby causing rust to form on these enclosures. Additionally, if these enclosures are dyed, the dissolution of these seals can cause an undesirable iridescent effect of the anodized layer. Accordingly, there is a need to plug anodized layers to prevent corrosion.

SUMMARY

This paper describes various embodiments that relate generally to enclosures for portable electronic devices that include metal oxide layers. More particularly, the described embodiments relate to metal oxide layers having dehydrated plugs that impart these enclosures with increased corrosion resistance.

According to some embodiments, an enclosure for a portable electronic device is described. The enclosure includes a metal substrate and a dehydrated anodized layer overlaying the metal substrate. The dehydrated anodized layer includes pores having openings that extend from an external surface of the dehydrated anodized layer and towards the metal substrate, and a metal oxide material that plugs the openings of the pores, where a concentration of the metal oxide material is between about 3 wt % to about 10 wt %.

According to some embodiments, an enclosure for a portable electronic device is described. The enclosure includes an aluminum alloy substrate and a dehydrated anodic layer that overlays the aluminum alloy substrate. The dehydrated anodic layer includes pores having openings, and a moisture-impermeable barrier that includes aluminum oxide, wherein the aluminum oxide plugs the openings of the pores.

According to some embodiments, a method for sealing an enclosure for a portable electronic device, the enclosure including a metal substrate and an anodized layer that overlays the metal substrate and includes openings that extend from an external surface of the anodized layer and towards the metal substrate, is described. The method includes sealing the openings of the anodized layer with hydrated material, and forming dehydrated material within pores of the anodized layer by dehydrating the hydrated material, where the dehydrated material plugs the openings of the pores.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The disclosure will be readily understood by the following detailed description in conjunction with the accompanying drawings, wherein like reference numerals designate like structural elements.

FIGS. 6A-6C illustrate cross-sectional views of a process for plugging pores of a metal oxide layer that includes dye particles disposed therein, in accordance with some embodiments.

DETAILED DESCRIPTION

Figure 1:
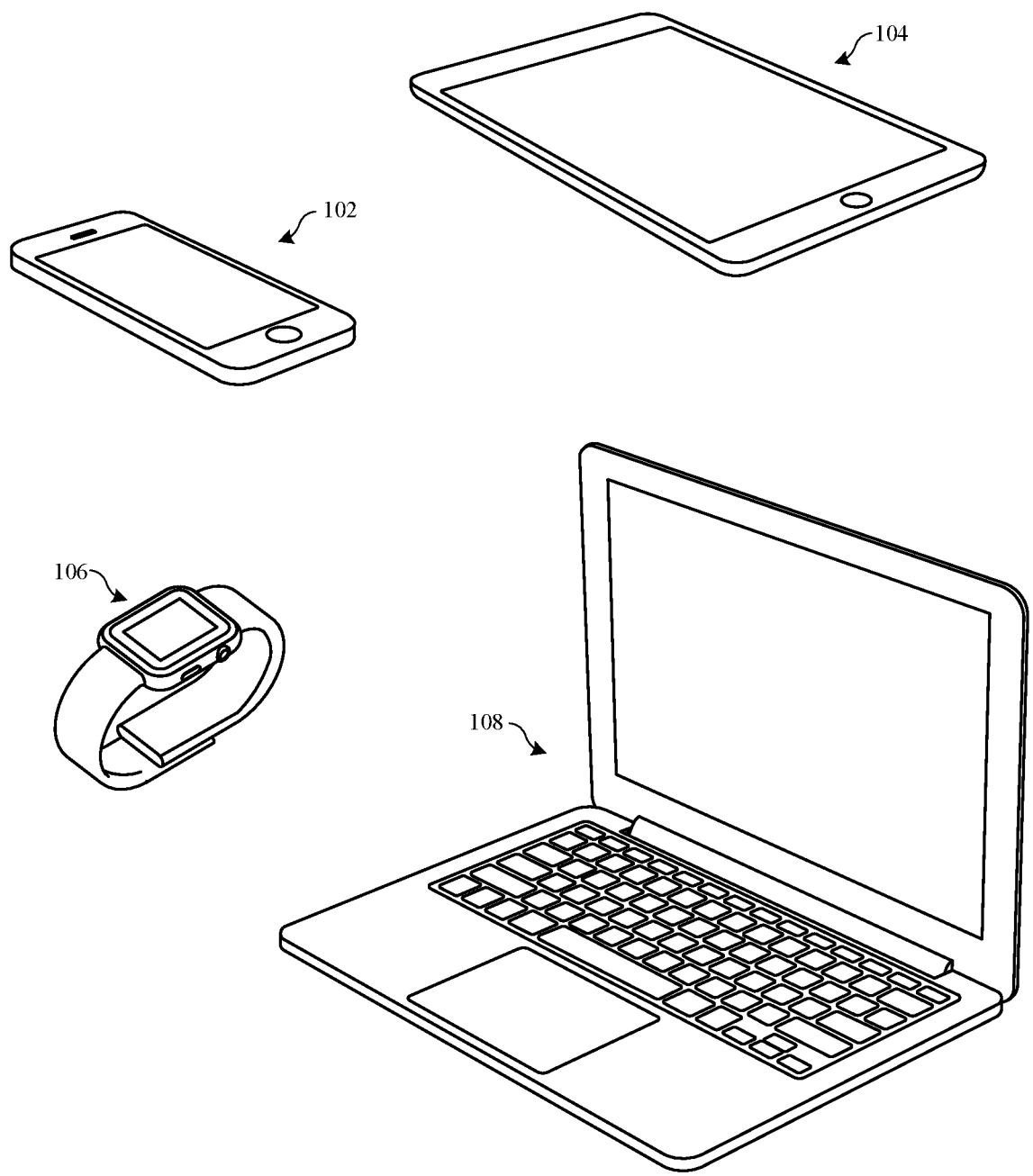
FIG. 1 illustrates perspective views of various portable electronic devices having enclosures that may be processed using the techniques described herein, in accordance with some embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The embodiments described herein set forth techniques for enhanced sealing of anodized parts. In particular, the techniques described herein set forth techniques for preventing corrosion of metal oxide material of dyed anodized parts when exposed to external contaminants (e.g., oil, salt, debris, etc.), thereby fixing the color of the dyed anodized parts over prolonged usage when utilized as enclosures for portable electronic devices. Additionally, the techniques described herein set forth techniques for forming a rehydrated impermeable barrier that prevents flow of corrosion-causing ions from passing through the anodized layer.

One attempt at fixing the color of the dyed anodized parts involves sealing the dye particles within pores of the anodized layer. According to some examples, anodized layers of enclosures may be sealed by a hydrothermal sealing process where pores of the anodized layers become plugged by expansion of pore walls during the hydrothermal sealing process. While these enclosures may be dyed a wide spectrum of colors through organic dyeing of the anodized layers, these enclosures remain susceptible to discoloration due to natural ageing based on exposure to external contaminants. Indeed, although these enclosures having dyed particles may be sealed using a hydrothermal sealing process, the hydrothermal seals are susceptible to surface degradation and cosmetic deterioration—notably in conditions of periodic or continuous immersion in water environment (e.g., swimming in pools, surfing in the ocean, etc.). Indeed, even an objectively "good" hydrothermal seal (e.g., having a 1 kHz admittance value of less than 400 times the reciprocal of its thickness when measured within 48 hours after sealing) is susceptible to such surface degradation of its hydrothermal seals. Furthermore, the susceptibility of the hydrothermal seal to degradation is even more noticeable when the enclosures are dyed dark colors (e.g., black) as the outer surface of the enclosures dominates the visual appearance.

The embodiments described herein set forth techniques for forming enclosures for portable electronic devices having dehydrated material that plug the pore structures of the metal oxide layer. The plugs for the pore structures of the metal oxide layers as descried herein may be manufactured and shipped to consumers in an intentionally dehydrated state. Beneficially, by shipping these enclosures to consumers in the intentionally dehydrated state, the metal oxide layers of these enclosures demonstrate little to no loss in the dehydrated material that plugs the pore structures and protects the underlying metal substrate from external elements. Indeed, even enclosures that are shipped to consumers with a conventional hydrothermal seal are highly unlikely to encounter the appropriate circumstances which would lead to the formation of a dehydrated plug. For instance, the techniques described herein set forth applying a low vacuum pressure of $3\times10^3$ to $1\times10^{-1}$ Pa for at least 1-2 hours in order to dehydrate the material that makes up the hydrothermal seal.

According to some embodiments, an enclosure for a portable electronic device is described. The enclosure includes a metal substrate and a dehydrated anodized layer overlaying the metal substrate. The dehydrated anodized layer includes pores having openings that extend from an external surface of the dehydrated anodized layer and towards the metal substrate, and a metal oxide material that plugs the openings of the pores, where a concentration of the metal oxide material is between about 3 wt % to about 10 wt %.

As used herein, the terms anodic film, anodized film, anodic layer, anodized layer, anodic oxide coating, anodic layer, anodic oxidized layer, metal oxide layer, oxide film, oxidized layer, and oxide layer can be used interchangeably and refer to any appropriate oxide layers. The oxide layers are formed on metal surfaces of a metal substrate. The metal substrate can include any of a number of suitable metals or metal alloys. In some embodiments, the metal substrate can include aluminum, and the aluminum is capable of forming an aluminum oxide when oxidized. In some embodiments, the metal substrate can include an aluminum alloy. As used herein, the terms part, layer, segment, and section can also be used interchangeably where appropriate. Additionally, the term "plug" is structurally and functionally distinct from the term "seal." In particular, the term "plug" may refer to a physical obstruction of an extremity of pore structures by plugging openings of the pore structures.

These and other embodiments are discussed below with reference to FIGS. 1, 2A-2F, 3-5, 6A-6C, 7A-7B, and 8. However, those skilled in the art will readily appreciate that the detailed description given herein with respect to these figures is for explanatory purposes only and should not be construed as limiting.

FIG. 1 illustrates various portable electronic devices that can be processed using the techniques as described herein. The techniques as described herein can be used to process metallic surfaces (e.g., metal oxide layers, etc.) of enclosures of the portable electronic devices. FIG. 1 illustrates a smartphone 102, a tablet computer 104, a smartwatch 106, and a portable computer 108. It is well understood that the use of personally identifiable information that is capable of being transmitted, received, and/or managed by these portable electronic devices should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

According to some embodiments, the metallic surfaces can refer to a metal oxide layer that overlays a metal substrate. In some examples, the metal oxide layer is formed from the metal substrate during an anodization process. The metal oxide layer can function as a protective coating to protect the metal substrate, for example, when these portable devices are dropped, scratched, chipped, or abraded. Additionally, the metal oxide layer can include pore structures that may be plugged such as to external contaminants from reaching the metal substrate.

In some examples, such as where the metal substrate includes aluminum or an aluminum alloy, the metal oxide layer can be formed over the metal substrate and can include pore structures (or pores) that are formed through the metal oxide layer and can extend from an external surface of the metal oxide layer and towards a barrier layer that separates the metal oxide layer from the underlying metal substrate.

Additionally, according to some embodiments, each of the pore structures of the metal oxide layer can be capable of receiving dye particles which can imbue the metal oxide layer with a specific color associated with the dye particles. In some examples, the metal oxide layer can be imparted with different dye colors based on the dye particles that are deposited within the pore structures. In some examples, the color of the metal oxide layer can be characterized according to L*a*b* color-opponent dimension values. The L* color opponent dimension value is one variable in an L*a*b* color space. In general, L* corresponds to an amount of lightness. L*=0 represents the darkest black while L*=100 represents white.

FIGS. 2A-2F illustrate cross-sectional views of a metal part 200 undergoing various processes for forming a plug therein for increased corrosion resistance, in accordance with some embodiments. In some embodiments, the metal part 200 has a near net shape of a final part, such as the enclosures of the portable electronic devices 102, 104, 106, and 108.

Figure 2A:
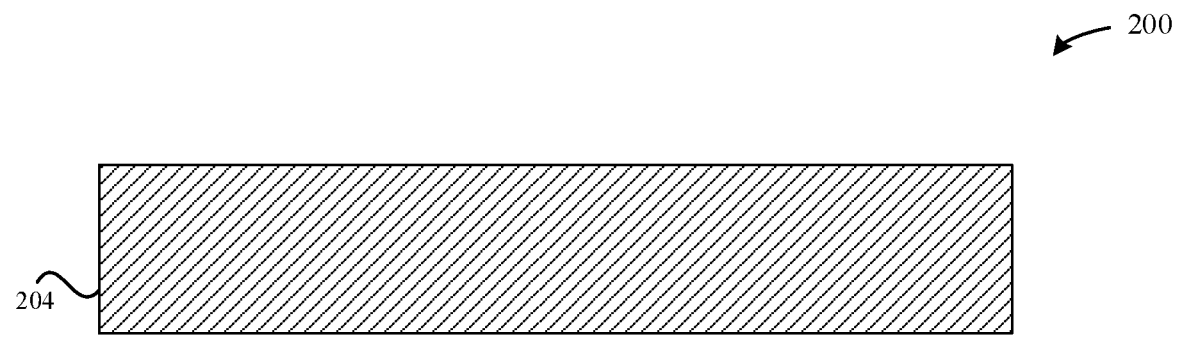
FIGS. 2A-2F illustrate cross-sectional views of a process for plugging pores of a metal oxide layer, in accordance with some embodiments.

FIG. 2A illustrates the metal part 200 prior to undergoing an anodization process. In particular, FIG. 2A illustrates that the metal part 200 corresponds to a metal substrate 204. The metal substrate 204 may have any thickness that is suitable for providing sufficient hardness and rigidity to protect electronic component(s) that are carried within the portable electronic device.

The metal substrate 204 may be subject to one or more pre-anodization processes. In some examples, the pre-anodization processes of the metal substrate 204 include at least one of polishing, texturizing, buffering, and the like. Beneficially, in this manner, surface(s) of the metal substrate 204 may assume any number of desired surface geometries and surface finishes. In some examples, the metal substrate 204 is a three-dimensional structure having a height, width, and depth, and the metal substrate 204 can have any type of geometry that is suitable for forming an overlaying metal oxide layer, as will be described herein. In particular, the geometry of the metal substrate 204 may be characterized as rectangular, polygonal, circular, beveled edges, angular edges, elliptical, etc.

Figure 2B:
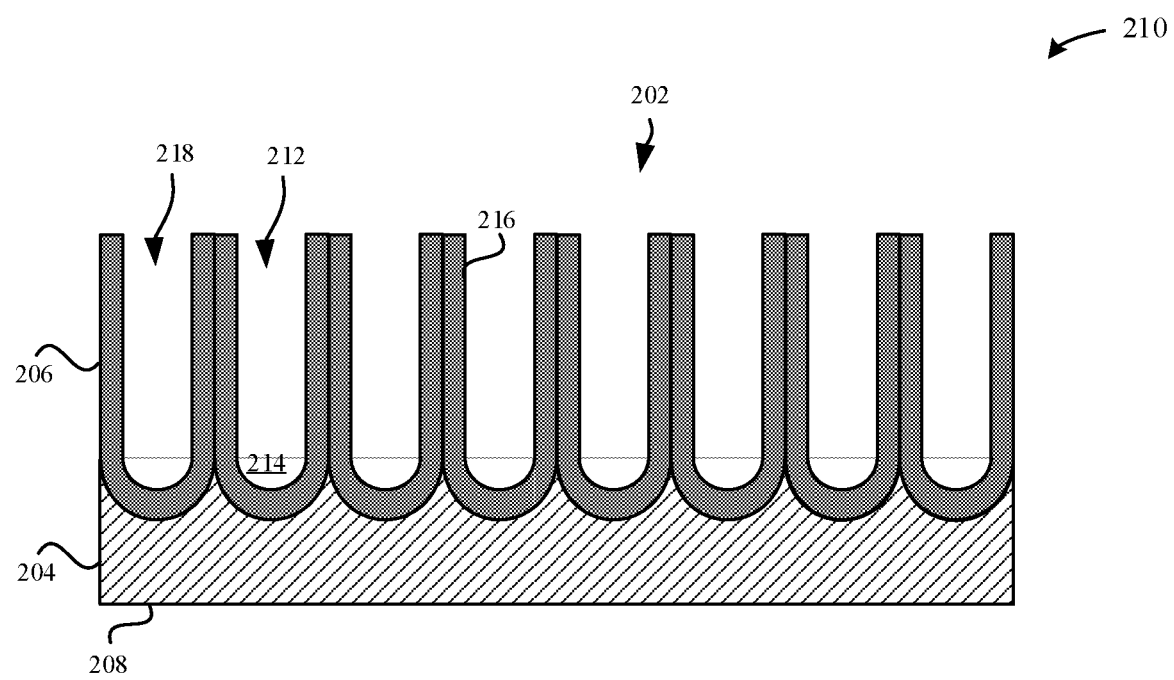

FIG. 2B illustrates an anodized part 210, in accordance with some embodiments. For example, FIG. 2B illustrates the metal part 200 subsequent to undergoing the anodization process. As illustrated in FIG. 2B, the metal oxide layer 206 may be formed from the metal substrate 204. The metal oxide layer 206 may include an external surface 202, where the external surface 202 of the metal oxide layer 206 is generally parallel to a bottom surface 208 of the metal substrate 204. In some examples, the metal oxide layer 206 is formed as a result of an electrolytic anodizing process. In particular, during the electrolytic anodizing process, a portion of the metal substrate 204 is converted or consumed by the conversion to the metal oxide layer 206.

According to some examples, the metal oxide layer 206 has a thickness between about 1 micrometer to several tens of micrometers. In some examples, the thickness is between about 5 micrometers to about 15 micrometers.

According to some embodiments, the metal oxide layer 206 includes pore structures 212 that extend from the external surface 202 of the anodized part 210 towards the metal substrate 204. The pore structures 212 may include bottom surfaces 214. The pore structures 212 are defined by pore walls 216 characterized as having generally columnar shapes that are elongated in a direction generally perpendicular to a central plane of the external surface 202 of the anodized part 210. The pore structures 212 include openings 218 that may be sealed with hydrated material, and then subsequently plugged with dehydrated material, as described in greater detail herein.

According to some examples, the metal substrate 204 may be comprised of aluminum or an aluminum alloy. As a result, the metal oxide layer 206 formed from the metal substrate 204 may be comprised of aluminum oxide. Additionally, the metal substrate 204 can include alloying elements (e.g., copper, zirconium, magnesium, etc.) that may impart increased adhesion between the metal oxide layer and the metal substrate 204, as described in application Ser. No. 14/830,699 entitled "PROCESSES TO AVOID ANODIC OXIDE DELAMINATION OF ANODIZED HIGH STRENGTH ALUMINUM ALLOYS, which is being incorporated by reference in its entirety for all purposes.

Figure 2C:
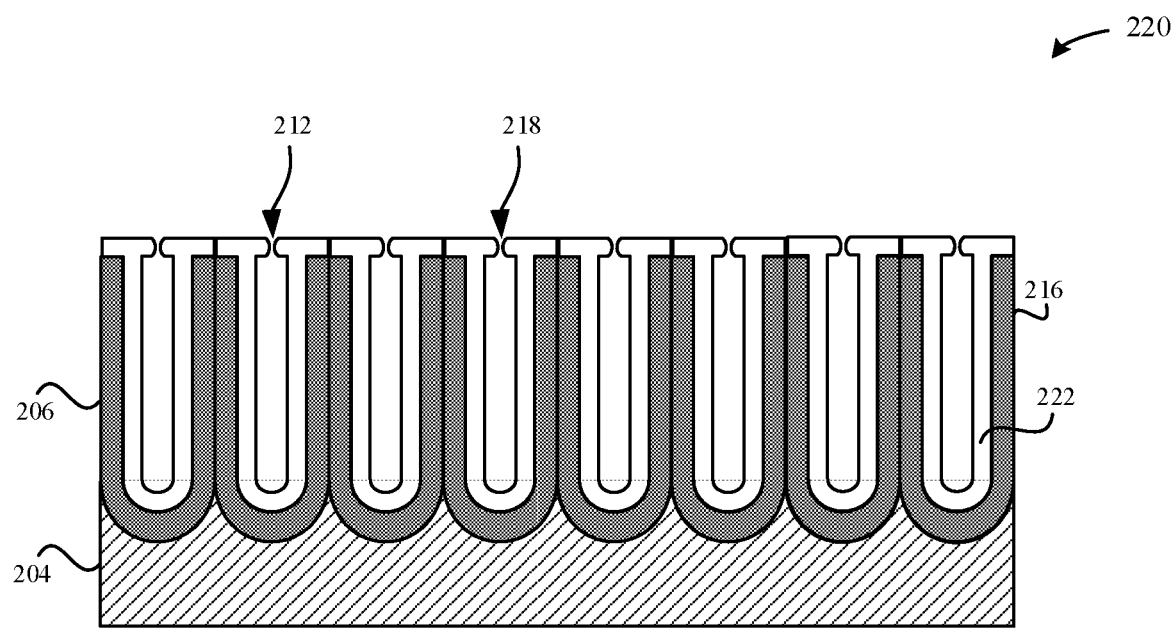

FIG. 2C illustrates a partially-sealed part 220, in accordance with some embodiments. In some examples, the partially-sealed part 220 represents the anodized part 210 while undergoing a hydrothermal sealing process. During the hydrothermal sealing process, the anodized part 210 is exposed to a sealing solution so as to cause precipitation of hydrated aluminum oxide (e.g., boehmite, etc.). In particular, the hydrothermal sealing process causes swelling of the aluminum oxide of the metal oxide layer 206 while immersed in the sealing solution. Swelling of the aluminum oxide causes the openings 218 to narrow, thereby minimizing external elements from diffusing into the pore structures 212. Swelling of the openings 218 may also cause oxidized fragments or metal oxide material to be retained within the metal oxide layer 206. For instance, dye oxide particles may be retained within the pore structures 212. During the hydrothermal sealing process, the alumina (of aluminum oxide) is converted to a hydrated material 222, such as aluminum oxide hydroxides (e.g., boehmite, diaspore, etc.) that results in swelling or volume increase of the oxide particles to partially close or partially seal the openings 218 of the pore structures 212. In some examples, the hydrated material 222 uniformly lines the pore walls 216 of the pore structures 212. The hydrated material 222 may refer to generally insoluble hydroxide material.

In some examples, the hydrothermal sealing solution involves filling in the pore structures 212 by hydrating the amorphous aluminum material of the pore walls 216 to a gel of boehmite and/or bayerite such that the amorphous aluminum material swells and closes the openings 218 of the pore structures 212. In some examples, the hydrothermal sealing process may be performed in steam, hot water (e.g., at or near boiling temperature with additives to reduce smutting), or at a temperature as low as about 70° C. In some examples, the hydrothermal sealing may be enhanced by using nickel acetate which additional precipitates the metal hydroxides in the pore structures 212. In some examples, the hydrothermal sealing solution is hot aqueous solution (e.g., greater than 80° C.). In some examples, the metal oxide layer 206 is exposed to a 5 g/l solution of nickel acetate at a temperature of 97° C. for a duration of 25 minutes.

Figure 2D:
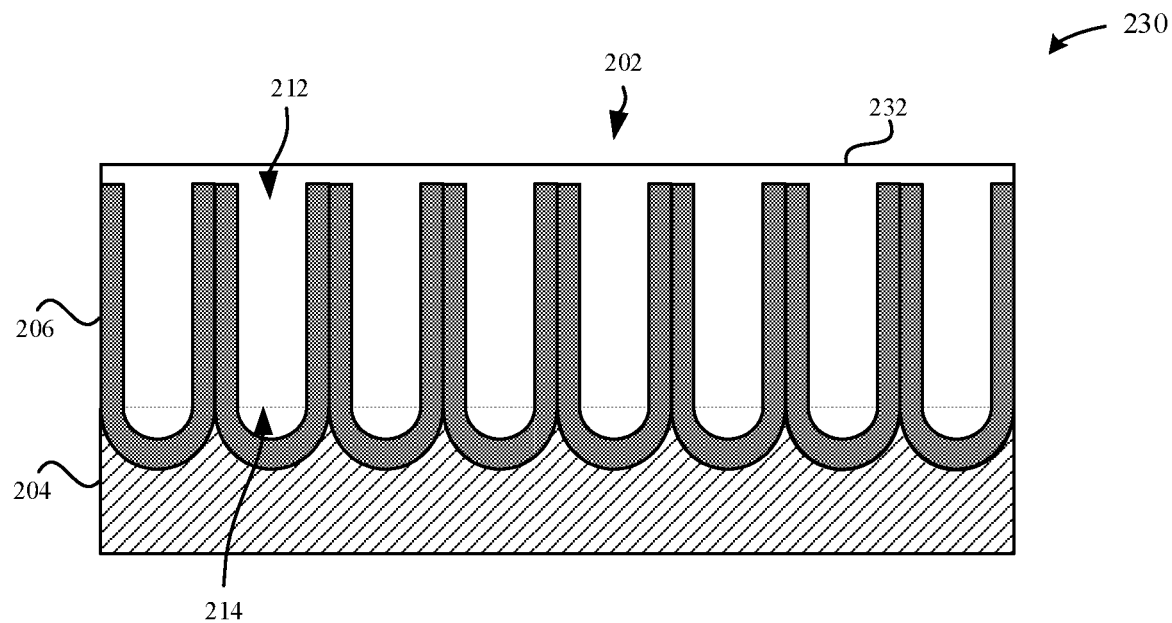

FIG. 2D illustrates a hydrothermally sealed part 230, in accordance with some embodiments. In some examples, the hydrothermally sealed part 230 represents the anodized part 210 subsequent to completion of the hydrothermal sealing process. In contrast to the partially-sealed part 220, the openings 218 of the pore structures 212 of the hydrothermally sealed part 230 are sealed such as to prevent external contaminants from diffusing through the pore structures 212 to reach the metal substrate 204. In some examples, the pore structures 212 include hydrated material 222 (e.g., aluminum oxide hydroxides, etc.) that seals the openings 218. In particular, the aluminum oxide hydroxides include boehmite, bayerite, diaspore, and the like. In some examples, the aluminum oxide hydroxides has a greater volume than the aluminum oxide. The hydrated material 222 is a structural seal that seals in the openings 218 of the pore structures 212. According to some embodiments, the hydrothermally sealed part 230 includes uniform levels of hydrated material 222 along the pore walls 216 of the pore structures 212. In some examples, the hydrated material 222 forms the seal that generally corresponds to the external surface 202 of the anodized part 210.

According to some examples, the hydrothermally sealed part 230 prevents external contaminants (e.g., oils, dirt, etc.) from being absorbed into the pore structures 212. One example of measuring the quality of the seals of the hydrated material 222 is to perform a dye spot test where the inability of a sealed surface to absorb dye particles is measured. Other tests of seal quality include the quantitative measures of electrochemical impedance spectroscopy (EIS), a simplified variant of EIS performed at a fixed frequency (typically 1 kHz) called "admittance" testing, and acid dissolution testing (ADT).

According to some examples, the hydrothermally sealed part 230 includes between about 8%-12% mass that may be attributed to water, such as a hydrate within boehmite ($\gamma$-AlOOH) or bayerite ($\alpha$-Al(OH)3) or ($\beta$-Al(OH)3). In some examples, about 25% of a volume of the metal oxide layer 206 of the hydrothermally sealed part 230 includes a hydrate of bayerite or up to about 45% of a volume of the metal oxide layer 206 of the hydrothermally sealed part 230 includes a hydrate of boehmite. In some examples, the metal oxide layer 206 includes between about 25% to about 45% volume of a hydrate of bayerite or boehmite.

Figure 2E:
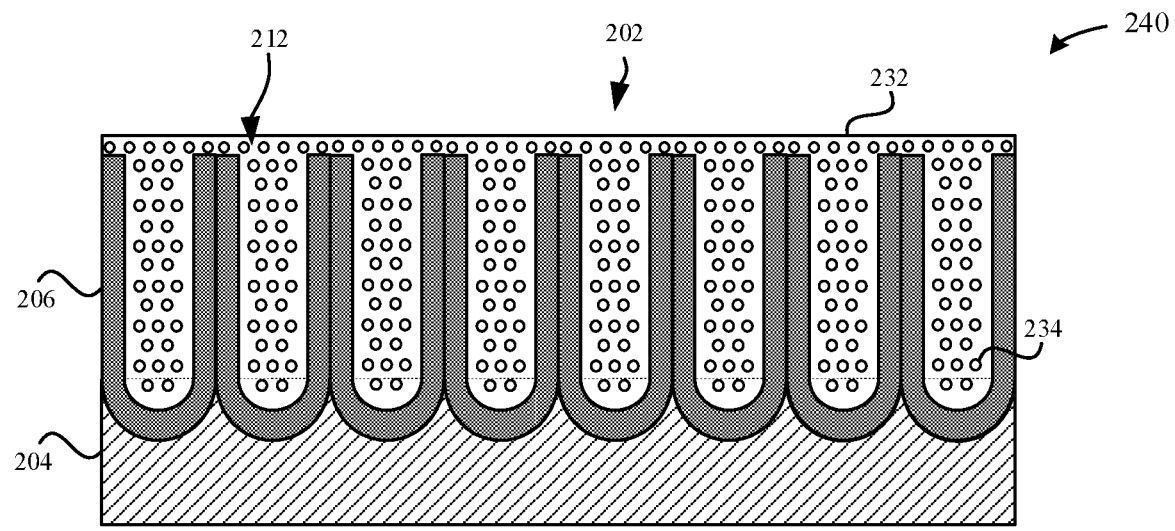

FIG. 2E illustrates a dehydrated part 240, in accordance with some embodiments. In some examples, the dehydrated part 240 is formed subsequent to exposing the hydrothermally sealed part 230 to a dehydration process. In some examples, the dehydration process includes exposing the hydrothermally sealed part 230 or the partially-sealed part 220 to at least one of heat or by desiccation (e.g., vacuum pressure). As illustrated in FIG. 2E, the dehydrated part 240 may include dehydrated material 232, such as $\gamma$-alumina ($Al_2O_3$) that is formed from dehydrating the hydrated material 222, such as boehmite ($\gamma$-AlOOH). The dehydrated material 232 may comprise a plug that plugs the openings 218 of the pore structures 212. As described herein, the term "plug" may refer to a physical obstruction of the extremity of the pore structures 212. Although FIG. 2E illustrates that the dehydrated part 240 includes dehydrated material 232 that extends throughout the entire length of the pore structures 212, in other examples, the dehydrated material 232 may only extend partially through the entire length of the pore structures (i.e., not the entire length). In particular, during the dehydration process, the hydrated material 222 (e.g., aluminum oxide hydroxides) that is closer to the external surface 202 may be preferentially dehydrated relative to hydrated material 222 that is closer to the bottom surface 214 of the pore structures 212. In other words, when subjecting the hydrothermally sealed part 230 to the dehydration process, the hydrated material 222 (e.g., aluminum oxide hydroxide) that is present near the external surface 202 is more likely to be converted to dehydrated material 232, such as aluminum oxide ($Al_2O_3$). Therefore, the concentration of dehydrated material 232 included within the pore structures 212 may taper off towards the bottom surfaces 214 of the pore structures 212. It should be noted that the pore structures 212 may share a combination of an amount of hydrated material 222 and an amount of dehydrated material 232.

In some examples, the dehydrated material 232 is a metal oxide material, such as $\gamma$-alumina ($Al_2O_3$) is characterized as having a fine, lamellar, porous microstructure. In particular, the porous microstructure is consistent with the loss of oxygen atoms 234 from the boehmite lattice. In some examples, the loss of oxygen atoms contributes to a difference in mass between the hydrothermally sealed part 230 and the dehydrated part 240 that is about 5% or less (in some instances 2% or less). In some examples, heating the hydrothermally sealed part 230 drives off about 5+/−2 wt % of water. In some examples, exposing the hydrothermally sealed part to vacuum pressure drives off up to 12 wt % of water. In other words, dehydrating (e.g., heating, vacuum pressure, etc.) the hydrated material 222 of the sealant of the metal oxide layer 206 contributes to a loss of about half of the water content (e.g., hydrate) of the metal oxide layer 206 from the hydrothermal sealing process. In some examples, a concentration of the dehydrated material 232 (e.g., dehydrated boehmite, dehydrated bayerite, etc.) is between about 3 wt % to about 10 wt %. In some examples, a concentration of the dehydrated material 232 is between about 0.5 wt % to about 10 wt %. Moreover, this loss in mass is not recovered, even if the dehydrated part 240 is exposed to a 60% humidity environment for a period of one week. In particular, the dehydrated part 240 would experience a maximum of 1% to 2% loss of water under further heat exposure (e.g., 85° C. at 2 hours) or vacuum pressure. In contrast, conventionally sealed anodic oxide layers when exposed to a dehydration process exhibit a corresponding loss in mass of about 15%.

In some embodiments, the loss of moisture is reflected in a difference in mass between the dehydrated part 240 and the hydrothermally sealed part 230. More particularly, the dehydrated material 232 has a lower physical density than the hydrated material 222. In some examples, the lower physical density of the dehydrated material 232 may be measured and quantified using a Fourier-Transform Infra-Red Spectroscopy (FTIR) which provides a signal upon the detection of an —OH bond. Indeed, the level of hydration of the hydrated material 222 may be proportionate to the stronger signal for the —OH bond.

In some embodiments, the dehydrated material 232 may also differ from the hydrated material 222 in terms of their respective ionic conductivity. In particular, there are fewer mobile ionic species present in the dehydrated material 232 relative to the hydrated material 222. The difference in mobile ionic species may be quantified using a 1 kHz electrochemical admittance test. In some examples, ionic conductivity was tested for samples of the dehydrated part 240 and the hydrothermally sealed part 230. All of the samples included a 12 μm thick metal oxide layer. Using the 1 kHz electrochemical admittance test, the plug comprised of the dehydrated material 232 exhibited an admittance of ~8-12 microSiemens, whereas the hydrated material 222 exhibited an admittance of ~18-23 microSiemens.

It should be noted that despite converting the hydrated material 222 to dehydrated material 232, the external surface 202 of the dehydrated part 240 may remain smooth. Like the hydrated material 222 of the hydrothermally sealed part 230, the dehydrated material 232 also provides a reliable barrier to prevent solids and/or liquids from penetrating into the metal substrate 204. Additionally, the pore structures 212 of the dehydrated part 240 remain plugged subsequent to the dehydration process as the dehydrated material 232 plugs the openings 218 of the pore structures 212. The dehydrated material 232 corresponds to a plug that physically obstructs the openings 218 of the pore structures 212.

Beneficially, intentionally dehydrating the seal of the hydrothermally sealed part 230 may preemptively prevent external contaminants from dissolving the hydroxide (—OH) of the aluminum oxide hydroxide during the normal use of the portable electronic device. When exposed to external contaminants, the external contaminants may consume the hydrated material 222, thereby reducing a height of the hydrated material 222 relative to a height of the external surface 202 of the pore walls 216. Consequently, the reduction in the amount of hydrated material 222 present within the pore structures 212 may facilitate the external contaminants to more easily and quickly reach the metal substrate 204, thereby causing corrosion. Furthermore, a reduction of the height of the hydrated material 222 relative to a height of the external surface 202 of the pore walls 216 may lead to an interference effect, as will be described in greater detail with reference to FIGS. 7A-7B. Thus, by preemptively dehydrating the seal of hydrated material 222, there is little to no hydroxide (—OH) that is available to be consumed during the dissolution process. Furthermore, it should be noted that the pore structures 212 remain sealed with the dehydrated material 232, as illustrated in FIG. 2E.

Figure 2F:
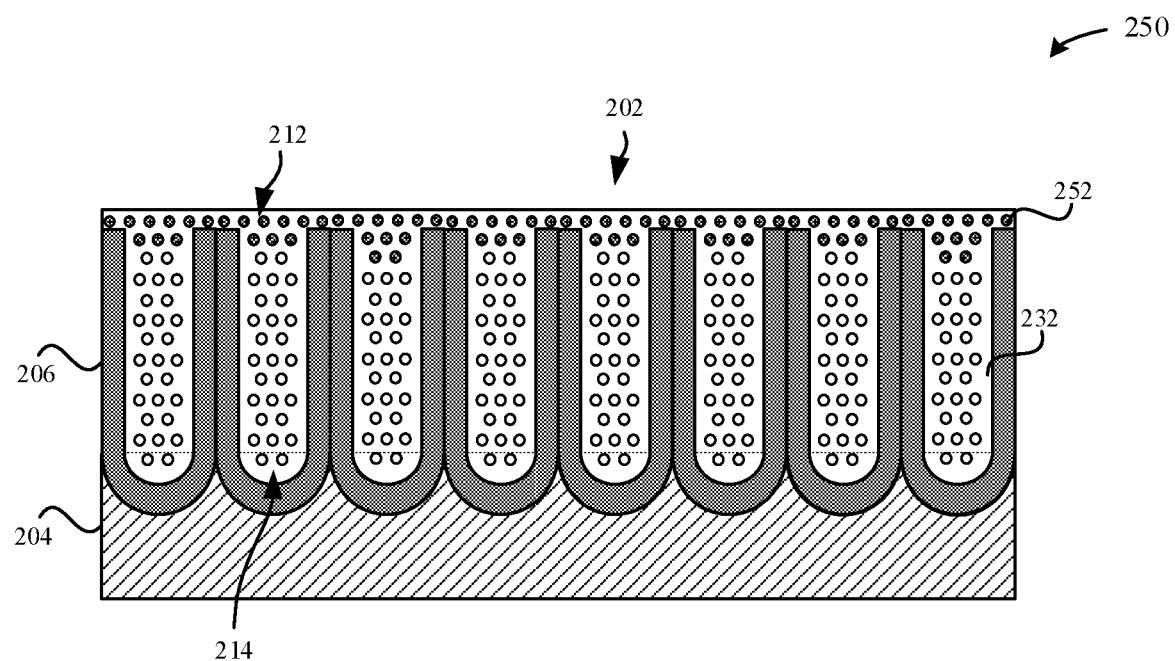

FIG. 2F illustrates a rehydrated part 250, in accordance with some embodiments. In some examples, the rehydrated part 250 corresponds to the dehydrated part 240 undergoing a rehydration process. In particular, the rehydration process may involve introducing water or moisture to at least some of the dehydrated material 232 that plugs the pore structures 212 of the dehydrated part 240. For instance, if the dehydrated part 240 corresponds to a metallic surface of the smart watch 106 that is exposed to salt water in the ocean during a user's surfing session, the dehydrated material 232 becomes hydrated. As a result, the dehydrated material 232 is converted to rehydrated material 252. It should be noted that the rehydrated material 252 still corresponds to a plug that plugs the openings 218 of the pore structures 212 despite the conversion of the dehydrated material 232 to rehydrated material 252. Indeed, the external surface 202 of the dehydrated part 240 is most susceptible to becoming exposed to moisture. As a result, the dehydrated material 232 closer to the openings 218 of the pore structures 212 and/or the external surface 202 is more preferentially rehydrated than other dehydrated material 232 disposed deeper in the pore structures 212. The rehydrated material 252 may include hydroxide material.

As illustrated in FIG. 2F, the rehydrated material 252 forms a rehydrated impermeable barrier 254. In some examples, the rehydrated impermeable barrier 254 is comprised of rehydrated material 252 that extends from the openings 218 and partially along a length of the pore structures 212. In particular, once the rehydrated impermeable barrier 254 is formed, the rehydrated impermeable barrier 254 acts as a diffusion barrier and/or moisture-impermeable barrier that plugs the openings 218 of the pore structures 212 and prevents moisture from passing through the pore structures 212 to reach underlying dehydrated material 232. As a result, the rehydrated material 252 does not extend along the entire length of the pore structures 212. In other words, below the rehydrated impermeable barrier 254 is dehydrated material 232 that lines the pore walls 216 of the pore structures 212.

The rehydrated impermeable barrier 254 may have a thickness that is between about 10 nanometers to about 30 nanometers. In some examples, the rehydrated impermeable barrier 254 plugs the openings 218 of the pore structures 212 and extends only partially along the length of the pore structures 212. The remaining volume of the pore structures 212 is occupied by the dehydrated material 232. The dehydrated material 232 (e.g., $\gamma$-$Al_2O_3$, etc.) may be characterized as having a fine, lamellar, porous microstructure. In particular, the porous microstructure is consistent with the loss of oxygen atoms 234 from the boehmite lattice.

It should be noted that the structure of the rehydrated part 250 is distinguished from the hydrothermally sealed part 230. In particular, the formation of the rehydrated impermeable barrier 254 makes it more difficult to hydrate the pore walls 216 of the pore structures 212. In other words, upon formation of the rehydrated impermeable barrier 254, no additional dehydrated material 232 that is disposed below the rehydrated impermeable barrier 254 will be rehydrated. Beneficially, the rehydrated impermeable barrier 254 may also prevent the dehydrated material 232 that is disposed below the rehydrated impermeable barrier 254 from being dissolved by external contaminants. For instance, the rehydrated impermeable barrier 254 can prevent and/or minimize the diffusion of external contaminants past the rehydrated impermeable barrier 254.

As understood by one of ordinary skill in the art, exposure of the dehydrated part 240 to the same sealing parameters used for forming the hydrothermally sealed part 230 will not result in the formation of a microstructure that is equivalent to the hydrothermally sealed part 230. Indeed, when the dehydrated part 240 is subject to a forced additional dehydration process, the dehydrated part 240 exhibits little to no loss in mass (i.e., ≤5%) due to moisture loss. In particular, the dehydrated material 232 of the dehydrated part 240 has an inability to lose additional mass during an additional dehydration process relative to the hydrothermally sealed part 230. In some examples, the dehydrated material 232 of the dehydrated part 240 will lose no more than ~1%-2% mass when subject to the additional dehydration process (e.g., 100° C. for ~30 minutes), whereas the hydrated material 222 of the hydrothermally sealed part 230 will lose ~5% mass when subject to the additional dehydration process (e.g., 100° C. for ~30 minutes).

Figure 3:
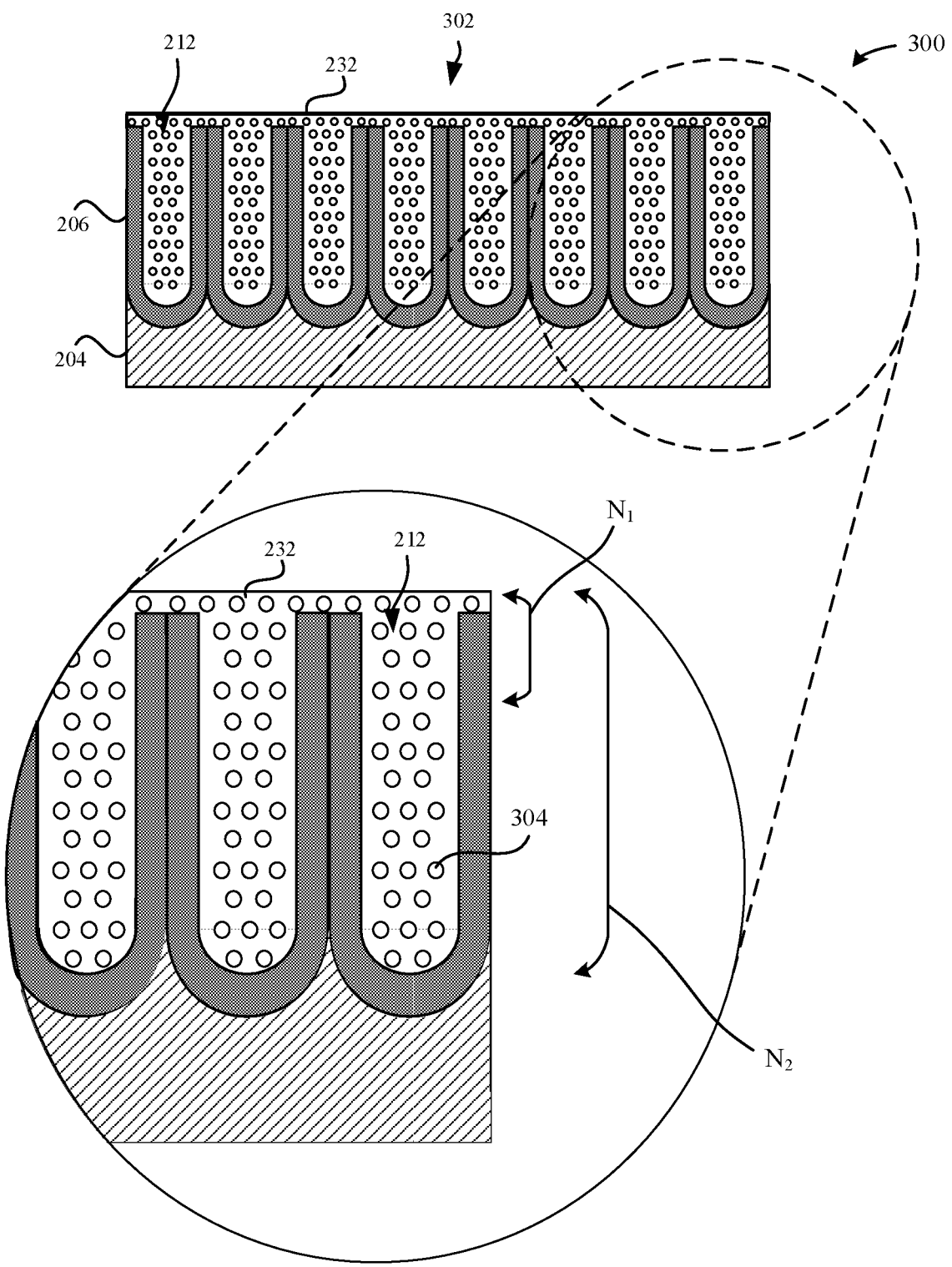
FIG. 3 illustrates a magnified cross-sectional view of a metal oxide layer having a plug, in accordance with some embodiments.

FIG. 3 illustrates a magnified cross-sectional view of a dehydrated part 300, in accordance with some embodiments. In some examples, FIG. 3 illustrates the dehydrated part 300 includes a metal oxide layer 206 having pore structures 212 that extend from the external surface 202 and towards the metal substrate 204. In some embodiments, the metal oxide layer 206 is separated from the metal substrate 204 by a non-porous barrier layer.

FIG. 3 illustrates dehydrated material 232 that is dispersed within the pore structures 212 of the dehydrated part 300. As described herein, during the hydrothermal sealing process, the dehydrated material 232 plugs openings 218 of the pore structures 212. In some examples, the dehydrated material 232 may uniformly line the pore walls 216 of the pore structures 212. For example, during the dehydration process, boehmite ($\gamma$-AlOOH) is dehydrated to form $\gamma$-alumina ($Al_2O_3$). In some examples, the dehydrated material 232 (e.g., $\gamma$-$Al_2O_3$, etc.) may be characterized as having a fine, lamellar, porous microstructure. In particular, the porous microstructure is consistent with the loss of oxygen atoms 304 from the boehmite lattice, as illustrated in FIG. 3. Although the loss of oxygen atoms 304 is consistent with a loss in mass of the metal oxide layer 206 (e.g., ≤5%), the structure of hydrated material 222 remains in the form of dehydrated material 232 which may act as a generally impermeable barrier. The generally impermeable barrier acts as a greater barrier to the flow of ions than conventional seals, as will be described in greater detail herein.

FIG. 3 illustrates that the dehydrated boehmite, γ-alumina, plugs the pore structures 212 and may extend from the openings 218 of the pore structures 212 and towards the metal substrate 204. In some examples, during the dehydration process, the hydrothermally sealed part 230 is exposed to at least one of heat or desiccation. In particular, during the dehydration process, the external surface 202 relative to other portions (e.g., sides, metal substrate, etc.) of the hydrothermally sealed part 230 may be exposed to the heat and/or desiccation such as to cause the hydrated material (e.g., boehmite, etc.) that is disposed closer to the openings 218 to be preferentially dehydrated. As a result, the hydrated material 222 closer to the openings 218 is preferentially dehydrated to form the dehydrated material 232 that plugs the openings 218.

In some embodiments, the hydrothermally sealed part 230 may be exposed to heat at a time duration between 1-2 hours at a temperature that is between 65° C. and 85° C. in order to dehydrate the hydroxide sealing material. It should be noted that if the hydrothermally sealed part 230 is heated at a temperature greater than 85° C. then the metal oxide layer 206 may be susceptible to cracking, which may be undesirable in that it may negatively affect the structural rigidity and integrity of the metal oxide layer 206. Furthermore, it should be noted that heating the hydrothermally sealed part 230 to a temperature of 150° C. or greater may result in aging the metal substrate 204, which may soften the metal substrate 204. Therefore, great control should be exercised to control the amount of time and the temperature of which the hydrothermally sealed part 230 is exposed to. In some embodiments, the upper temperature limit may be extended to higher than 85° C. when dehydrating a partially sealed part—e.g., the partially sealed part 400—as described in detail with reference to FIG. 4. Additionally, in some embodiments, the upper temperature limit may be extended to higher than 85° C. when the metal oxide layer 206 is sealed using a process such as zirconia or silicate capping layer, as described by U.S. patent application Ser. No. 15/686,026 entitled "PROTECTING ANODIZED SURFACES DURING MANUFACTURING PROCESSES," which is being incorporated herein by reference in its entirety for all purposes.

In some embodiments, the hydrothermally sealed part 230 may be exposed to vacuum pressure in order to dehydrate the hydrated material 222. In some examples, the hydrothermally sealed part 230 is exposed to the vacuum pressure at a time range between 30 minutes to 2 hours. In some instances, up to 50% of the moisture included within the hydrated material 222 present in the pore structures 212 is driven off within 30 minutes of applying vacuum pressure to the hydrothermally sealed part 230. In some examples, the range of vacuum pressure is between about $3\times10^3$ Pa to about $1\times10^{-1}$ Pa. In some examples, the vacuum pressure is applied for a period of at least 1-2 hours, and up to at least 12 hours.

In some examples, the longer that the hydrothermally sealed part 230 is exposed to at least one of the heat or vacuum pressure during the dehydration process, the more extensive is the conversion of the hydrated material 222 to dehydrated material 232. For instance, the extensive conversion of the hydrated material 222 to dehydrated material 232 where the thickness of the dehydrated material 232 is $X \geq N_1$ is indicative of the hydrothermally sealed part 230 being exposed to more than a superficial amount of heat and/or vacuum pressure. For example, if the hydrothermally sealed part 230 is exposed to heat at less than 65° C. for less than 10 minutes may be insufficient to dehydrate the hydrated material 222 to the extent necessary to form the dehydrated material 232 having a thickness that is $X \geq N_1$. It should be noted that $N_1$ corresponds to an amount of thickness of the dehydrated material 232 that is sufficient to prevent the aluminum oxide from being dissolved when the hydrothermally sealed part 230 is exposed to external elements (e.g., moisture, salt, debris, etc.). If the amount of thickness of the dehydrated material 232 is less than $N_1$, then the hydroxide group (—OH) that makes up the aluminum oxide is susceptible to being consumed. Consequently, the hydrothermally sealed part 230 may be susceptible to corrosion attack.

Beneficially, the dehydrated part 300 may exhibit up to a 50% improvement in impedance over conventional hydrothermally sealed anodized parts. Thus, the dehydrated part 300 exhibits resistance to corrosion attack that is common among conventional hydrothermally sealed anodized parts. For instance, the dehydrated part 300 is able to greatly resist corrosion attack to the extent that corrosion defects which would have been observed within 1 year in a conventional hydrothermally sealed anodized part would take about five years to be observed in the dehydrated part 300.

To illustrate this concept, FIG. 3 illustrates the dehydrated part 300 having dehydrated material 232 that extends throughout the length of the pore structures 212 such that the bottoms 214 of the pore structures 212 also include the dehydrated material. FIG. 3 illustrates that the thickness of the dehydrated material 232 (as measured from the external surface 202) within the pore structures 212 is $X=N_2$. It should be noted that the volume of the dehydrated material 232 that generally fills and plugs in the pore structures 212 of the dehydrated part 400 may be the same or generally equivalent to the volume of the hydrated material 222 that generally fills and seals in the pore structures 212 of the hydrothermally sealed metal part 230. In this manner, the hydrothermally sealed metal part 230 may also be referred to as a fully dehydrated part.

Figure 4:
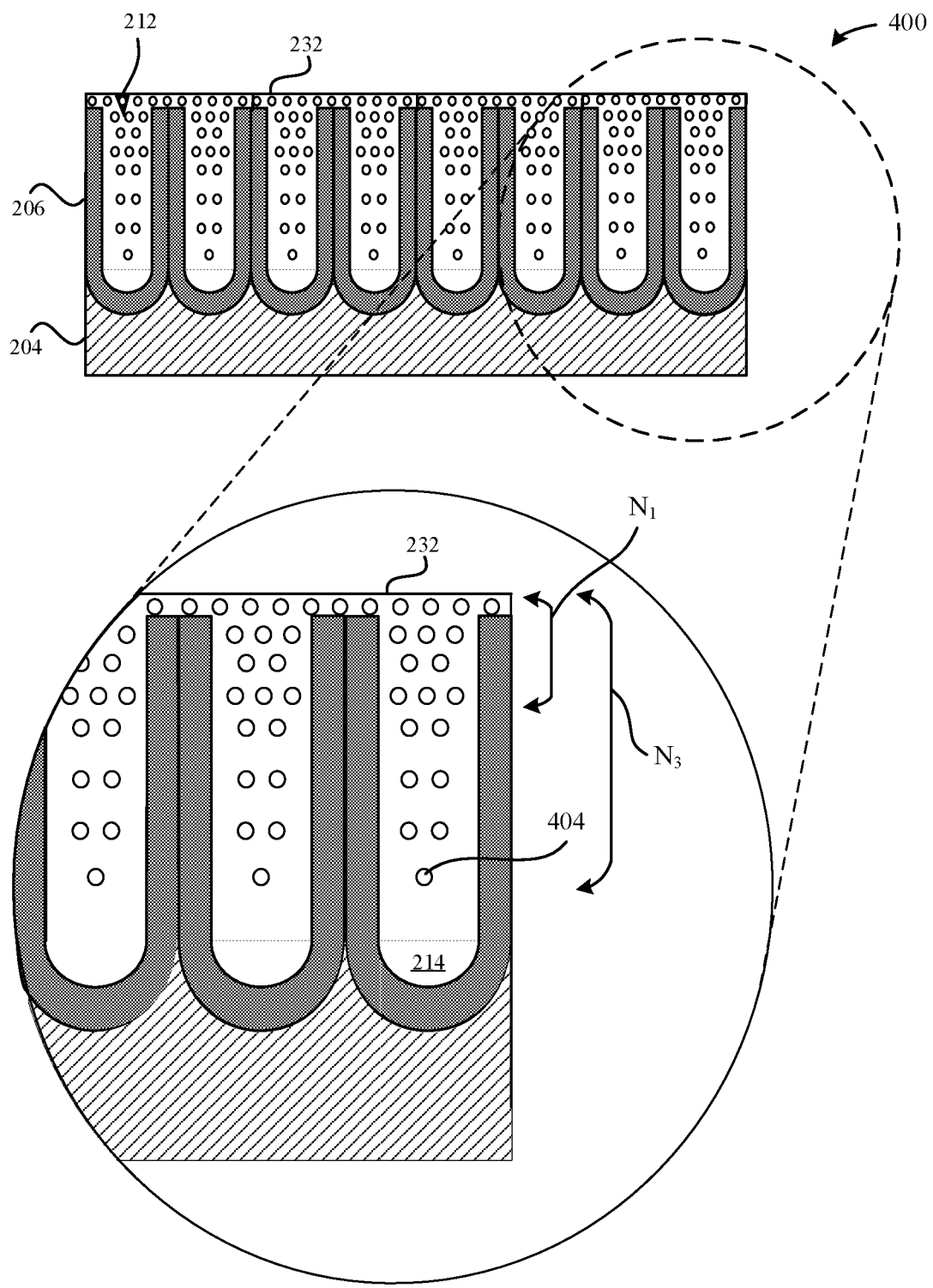
FIG. 4 illustrates a magnified cross-sectional view of a metal oxide layer having a plug, in accordance with some embodiments.

FIG. 4 illustrates a magnified cross-sectional view of a partially dehydrated part 400 subsequent to the completion of the dehydration process, in accordance with some embodiments. In particular, the dehydration process may be stopped and the partially dehydrated part 400 intentionally released from the dehydration environment and dehydration process before generally all of the hydrated material 222 is converted to dehydrated material 232. The partially dehydrated part 400 may be released from the dehydration environment so long as the thickness of the dehydrated material 232 as measured from the external surface 202 is $X \geq N_1$, which is sufficient for the partially dehydrated part 400 to resist corrosion attack from external elements. In some examples, the partially dehydrated part 400 includes dehydrated material 232 that only partially extends throughout the length of the pore structures 212. In some examples, the amount of the dehydrated material 232 may be more heavily concentrated towards the openings 218 of the pore structures 212 and less concentrated towards the bottom surfaces 214 of the pore structures 212. As illustrated in FIG. 4, the bottom surfaces 214 of the pore structures 212 may include a combination of dehydrated material 232 and hydrated material 222. Unlike the dehydrated part 300, the partially dehydrated part 400 does not include generally uniform dispersion of the loss of oxygen atoms 404 from the boehmite lattice.

As illustrated in FIG. 4, the thickness of the dehydrated material 232 is $X \geq N_1$, which is sufficient for the dehydrated part 4 to resist corrosion attack from external elements. In some examples, the thickness of the dehydrated material is between about 10 nm to about 30 nm. In other examples, the thickness of the dehydrated material is between about 10 nm to about 50 nm.

FIG. 4 illustrates dehydrated material 232 (e.g., aluminum oxide, etc.) that is dispersed within the pore structures 212. As described herein, during the hydrothermal sealing process, the dehydrated material 232 plugs the openings 218 of the pore structures 212. In some examples, the dehydrated material 232 partially lines the pore walls 216 of the pore structures 212. In some examples, the boehmite (γ-AlOOH) is dehydrated to form γ-alumina ($Al_2O_3$). In some examples, the dehydrated material 232 (e.g., γ-$Al_2O_3$, etc.) may be characterized as having a fine, lamellar, porous microstructure. In particular, the porous microstructure is consistent with the loss of oxygen atoms 404 from the boehmite lattice, as illustrated in FIG. 4. In contrast to the dehydrated part 300, the thickness of the dehydrated material 232 of the partially-dehydrated part 400 extends to a thickness of $X=N_3$, where $N_3<N_2$.

Figure 5:
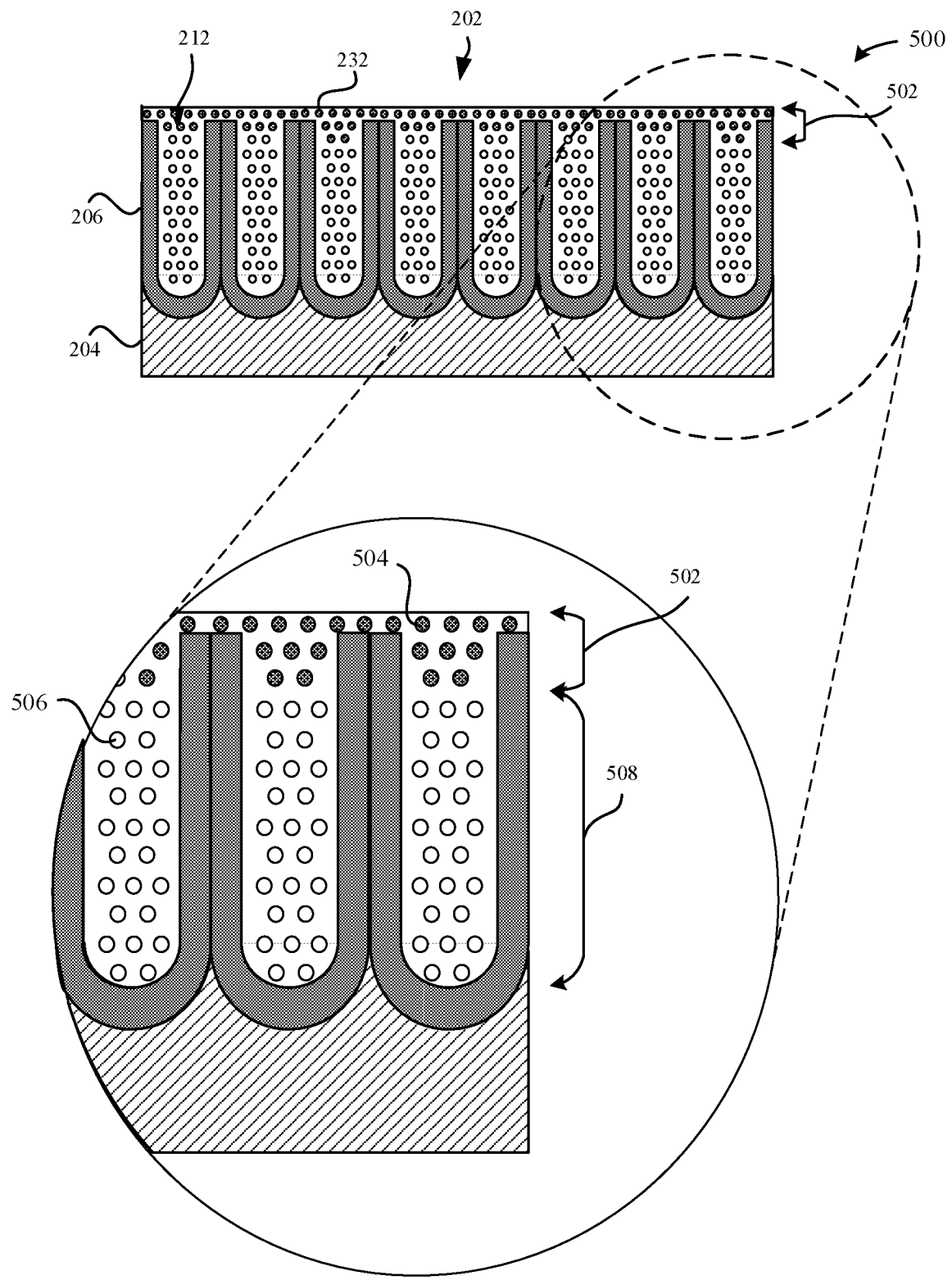
FIG. 5 illustrates a magnified cross-sectional view of a rehydrated metal oxide layer, in accordance with some embodiments.

FIG. 5 illustrates a magnified cross-sectional view of a rehydrated part 500 that corresponds to the rehydrated part 250 as illustrated in FIG. 2F, in accordance with some embodiments. As illustrated in FIG. 5, the rehydrated part 500 includes a rehydrated impermeable barrier 502 formed from the rehydrated material 252. The rehydrated material 252 includes rehydrated hydroxide particles 252. The rehydrated impermeable barrier 502 has a thickness that is $X \geq N_1$, which is to mean that the rehydrated impermeable barrier 502 is sufficient to prevent the dehydrated material 508 disposed below the rehydrated impermeable barrier 502 from being dissolved when exposed to external contaminants. The rehydrated impermeable barrier 502 may have a thickness that is between about 10 nanometers to about 30 nanometers. In some examples, the rehydrated impermeable barrier 254 extends only partially along the length of the pore structures 212. In some examples, the dehydrated material 232 (e.g., γ-$Al_2O_3$, etc.) may be characterized as having a fine, lamellar, porous microstructure. In particular, the porous microstructure is consistent with the loss of oxygen atoms 506 from the boehmite lattice. In some examples, the rehydrated impermeable barrier 502 is comprised of rehydrated material 504 that extends only partially along a length of the pore structures 212 from the openings 218 of the pore structures 212. In some embodiments, the rehydrated material 504 plugs the openings 218 of the pore structures 212.

In some examples, the rehydrated impermeable barrier 502 may be more resilient than the hydrated material 222 in resisting corrosion when exposed to external contaminants. This may be because the rehydrated impermeable barrier 254 starts from the external surface 202 and plugs the outer region, thereby inhibiting further, deeper rehydration of the dehydrated material 232. In effect, the rehydration process is almost irreversible. Moreover, the rehydrated impermeable barrier 502 provides a greater barrier than the hydrated material 222 in preventing the flow of ions through the metal oxide layer 206. Rather, the conventional hydrothermally sealed anodized parts have a hydrated gel-like state where the water provides a medium for ion flow.

Figure 6C:
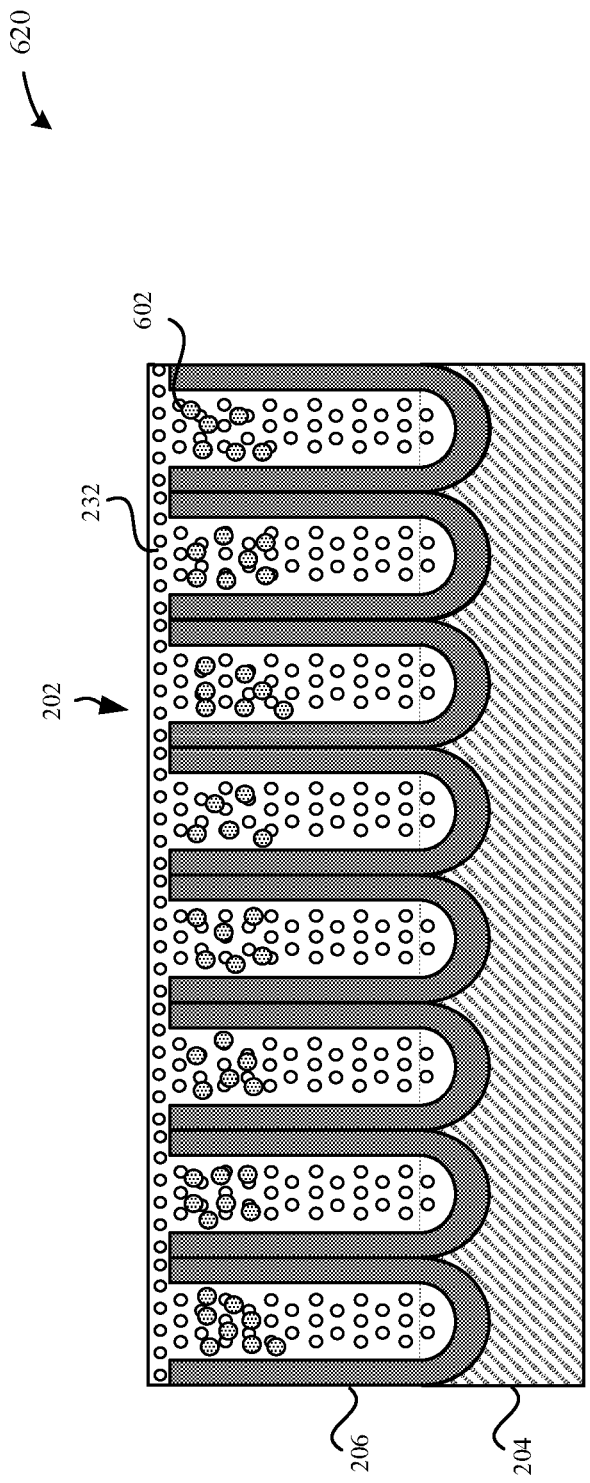

FIGS. 6A-6C illustrate cross-sectional views of a dyed part 600 undergoing various processes for forming an enhanced seal for increased corrosion resistance, in accordance with some embodiments. In some embodiments, the dyed part 600 has a near net shape of a final part, such as the enclosures of the portable electronic devices 102, 104, 106, and 108. In some examples, the resulting dyed part 600 may correspond to any one of the metallic surfaces of the portable electronic devices 102, 104, 106, and 108.

FIG. 6A illustrates the dyed part 600 while undergoing a hydrothermal sealing process, in accordance with some embodiments. FIG. 6A illustrates that the dyed part 600 includes dye particles 602 that are disposed within the pore structures 212. During the hydrothermal sealing process, hydrated material 222 acts to seal the openings 218 of the pore structures 212, thereby sealing the dye particles 602 within the pore structures 212. In some examples, the hydrated material 222 uniformly lines the pore walls 216 of the pore structures 212.

According to some examples, the dyed part 600 may be dyed a wide spectrum of colors through organic dyeing of the metal oxide layer 206. In some examples, the colors may be tuned by adjusting the parameters of the composition of the dye bath, such as concentration of the dye particles 602, pH level, time, and/or temperature of the dye bath. However, by maintaining a constant bath composition, the pH level, time, and/or temperature may be adjusted in order to fine-tune the dyed color to within DE of <1 of any given color target.

FIG. 6B illustrates a sealed dyed part 610 subsequent to the dyed part 600 being exposed to the hydrothermal sealing process, in accordance with some embodiments. As shown in FIG. 6B, the hydrated material 222 fills in the pore structures 212, thereby also sealing the dye particles 602 within the pore structures 212. As the metal oxide layer 206 is highly porous, the pore structures 212 should be sealed such as to permanently lock in the dyed color of the dyed part 600. In some examples, this is particularly true of sulfuric acid anodizing performed in accordance with Type II anodizing of Mil A 8625. Indeed, this type of anodic oxide coatings are mesoporous (i.e., $\sim 10^{11}$ pores per square centimeter, $\sim 20$ nm diameter of good wettability and very high aspect ratio).

FIG. 6C illustrates a dehydrated dyed part 620 formed by exposing the sealed dyed part 610 to a dehydration process, in accordance with some embodiments. In some examples, the dehydration process includes exposing the sealed dyed part 610 to at least one of heat or vacuum pressure. The dehydrated dyed part 620 includes dehydrated material 232, such as γ-alumina ($Al_2O_3$) that is formed from dehydrating boehmite (γ-AlOOH). The dehydrated material 232 plugs the openings 218 of the pore structures 212 such as to prevent external contaminants from reaching the metal substrate 204. Although FIG. 6C illustrates that the dehydrated dyed part 620 includes dehydrated material 232 that extends through the entire length of the pore structures 212, in other examples, the dehydrated material 232 may only extend partially through the entire length of the pore structures (i.e., not the entire length).

In some embodiments, during the dehydration process, the hydrated material 222 (e.g., aluminum oxide hydroxides) that is closer to the external surface 202 may be preferentially dehydrated relative to hydrated material 222 that is closer to the bottom surface 214 of the pore structures 212. In other words, when subjecting the hydrothermally sealed part 230 to the dehydration process, the aluminum oxide hydroxide that is present near the external surface 202 is more likely to be converted to aluminum oxide ($Al_2O_3$). Therefore, the concentration of dehydrated material 232 included within the pore structures 212 may taper off towards the bottom surfaces 214 of the pore structures 212.

According to some embodiments, the pore structures 212 of the dehydrated dyed part 620 may include any combination of dye particles 602, hydrated material 222, or dehydrated material 232. According to some examples, the dye particles 602 can include grey or black dye particles. The dye particles 602 may be distributed within the pore structures 212. In some examples, the dye particles 602 are uniformly distributed in the pore structures 212. By uniformly distributing the dye particles 602, the metal oxide layer 206 is imparted with a uniform deep grey or black color.

In some examples, the color of the metal oxide layer 206 can be characterized according to L*a*b* color-opponent dimension values. The L* color opponent dimension value is one variable in an L*a*b* color space. In general, L* corresponds to an amount of lightness. L*=0 represents the darkest black while L*=100 represents white. By implementing dark dyed particles, such as black, the L* value of the metal oxide layer is less than L*=40, Consequently, when the hydrated material 222 is dissolved by external contaminants, there is a more noticeable light iridescence effect due to the difference in color between the exterior surface 202 of the metal oxide layer 206 and the surface of the hydrated material 222. Conversely, because the dye particles 602 are generally distributed closer towards the bottom surfaces 214 of the pore structures 212, if the metal oxide layer 206 does not include dark color dye particles 602, then the difference in color between the external surface 202 of the metal oxide layer 206 and the hydrated material 222 is less noticeable. Thus, it may be preferable to prevent dissolution of the hydrated material 222 of the metallic surfaces of the portable electronic devices 102, 104, 106, 108 that are dyed in dark colors.

Figure 7A:
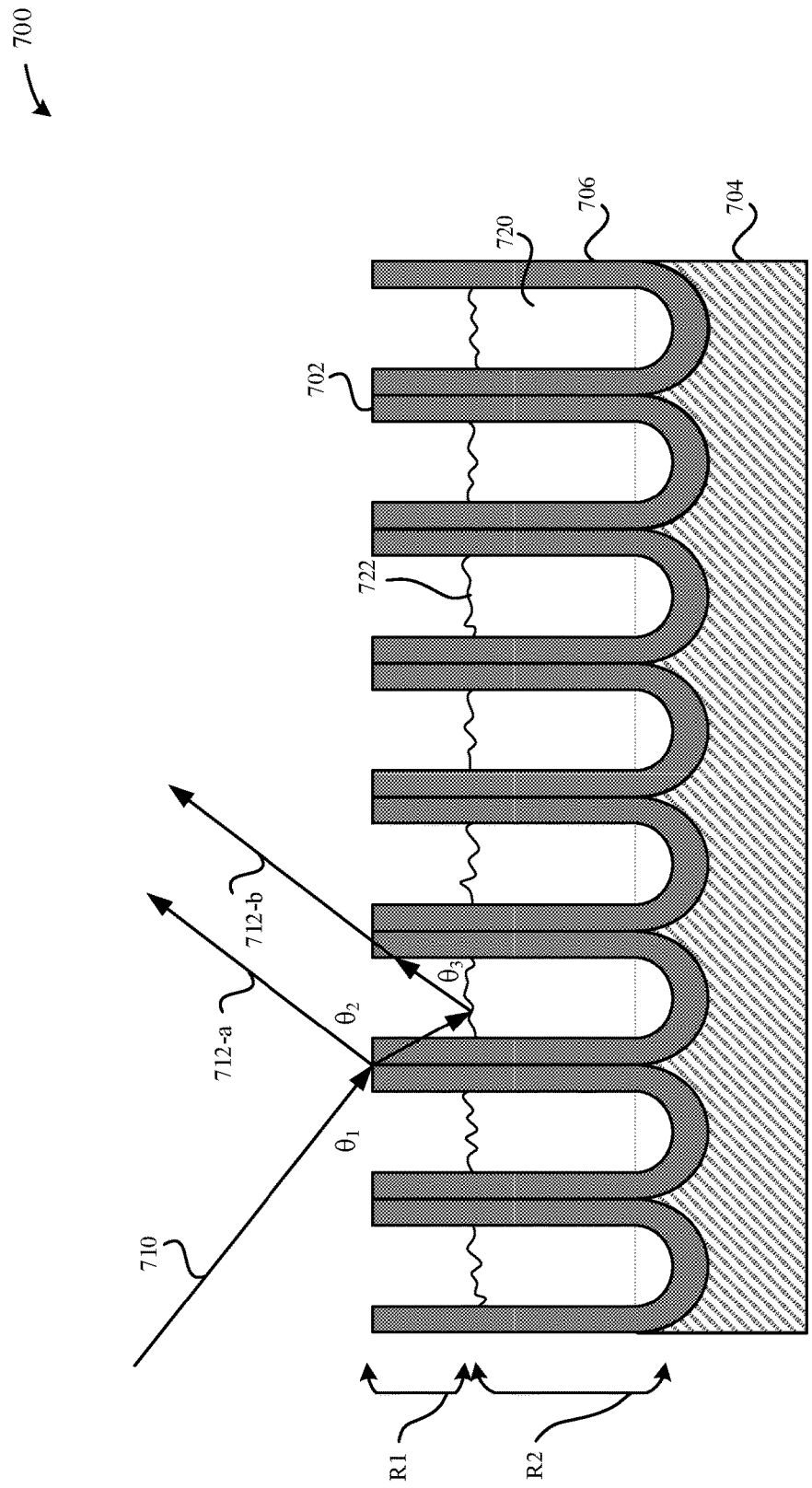
FIG. 7A illustrates a cross-sectional view of a conventional metal oxide layer that is susceptible to corrosion, thereby resulting in a light interference effect, in accordance with some embodiments.

FIG. 7A illustrates a schematic diagram of a cross-sectional view of a conventional sealed part 700, in accordance with some embodiments. In some examples, the sealed part 700 illustrated in FIG. 7A is subsequent to exposure to external contaminants. In particular, FIG. 7A illustrates an exaggerated iridescence effect when visible light ray 710 is incident upon the external surface 702 of the sealed part 700. As illustrated in FIG. 7A, the sealed part 700 includes a hydrothermal seal that is comprised of hydrated material 720. In particular, the sealed part 700 includes: R1=an amount of hydrated material which was previously dissolved from within the pore structures, and R2=an amount of hydrated material that remains within the pore structures. Consequently, when visible light ray 710 is incident upon the external surface 702 of the sealed part 700 at angle θ₁, the visible light ray 710 is reflected by the external surface 702 of the metal oxide layer 706 according to angle θ₂ as reflected light ray 712-a and a remaining amount of the visible light ray 710 is reflected by the upper surface 722 of the hydrated material 720 that remains within the pore structures 712 according to angle θ₃ as reflected light ray 712-b. Indeed, there is a positive causation between the intensity of the light iridescent effect and the difference in respective heights between the external surface 702 and the upper surface 722. For example, the greater the difference in respective heights, the greater the light iridescent effect.

Figure 7B:
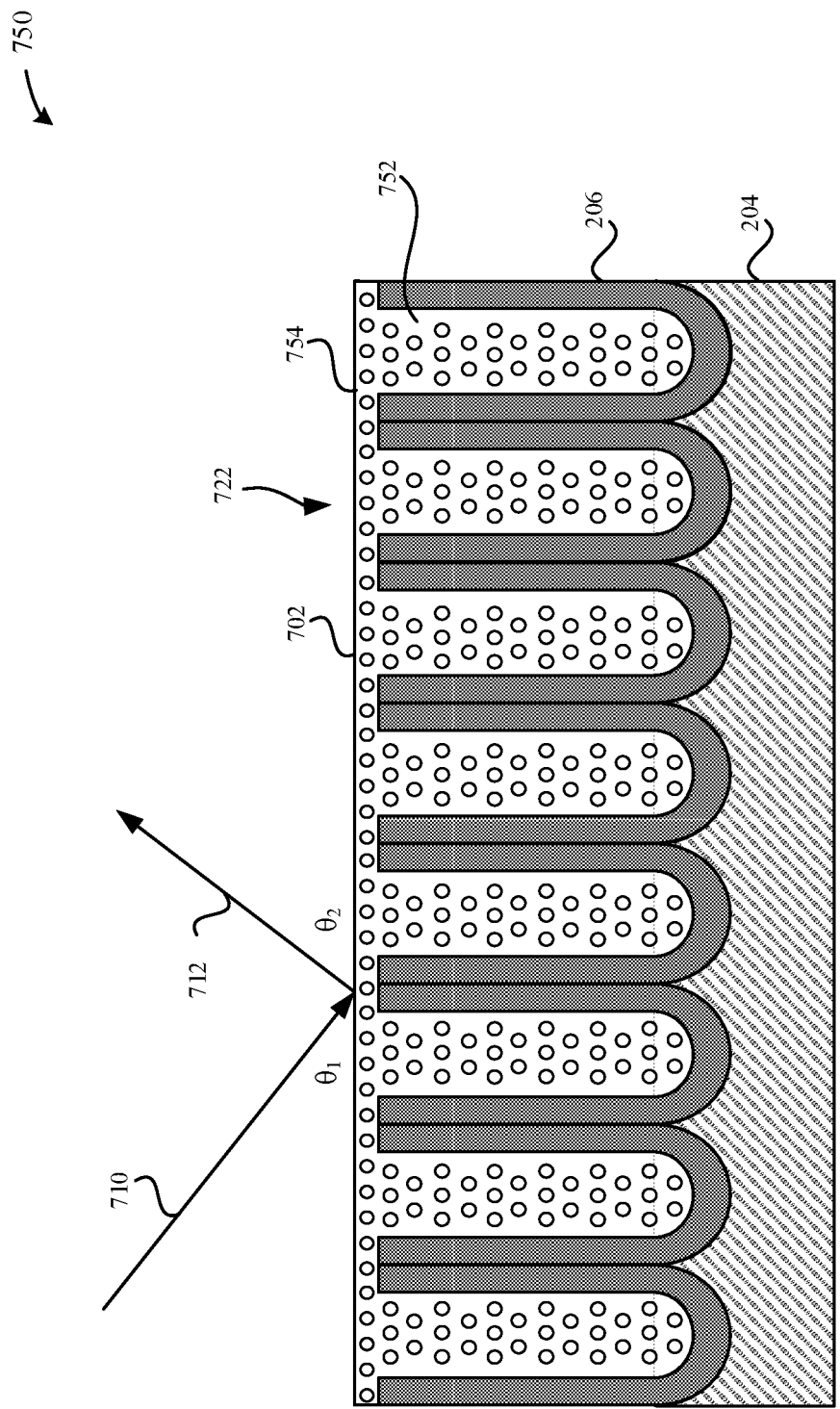
FIG. 7B illustrates a cross-sectional view of a metal oxide layer including a plug that prevents the light interference effect, in accordance with some embodiments.

FIG. 7B illustrates a schematic diagram of a cross-sectional view of a dehydrated plugged part 750, in accordance with some embodiments. As described herein, the dehydrated plugged part 750 may include a plug that plugs the openings of the pore structures 722. The plug includes dehydrated material—e.g., the dehydrated material 752—that is included within the pore structures 722 of the dehydrated plugged part 750. In some examples, the dehydrated plugged part 750 is represented in FIG. 7B subsequent to exposure to external contaminants over prolonged usage. As illustrated in FIG. 7B, the dehydrated plugged part 750 includes dehydrated material 752 that plugs the pore structures 722. In contrast to the sealed part 700, there is little or no difference in height between the upper surface 754 of the dehydrated material 752 and the external surface 702 of the metal oxide layer 706. Beneficially, when the visible light ray 710 is incident upon the external surface 702 of the sealed part 700, the visible light ray 710 is not reflected as multiple light rays by the metal oxide layer 706 and the dehydrated material 752, thereby preventing the light interference effect. Instead the visible light ray 710 is reflected as reflected light ray 712.

Figure 8:
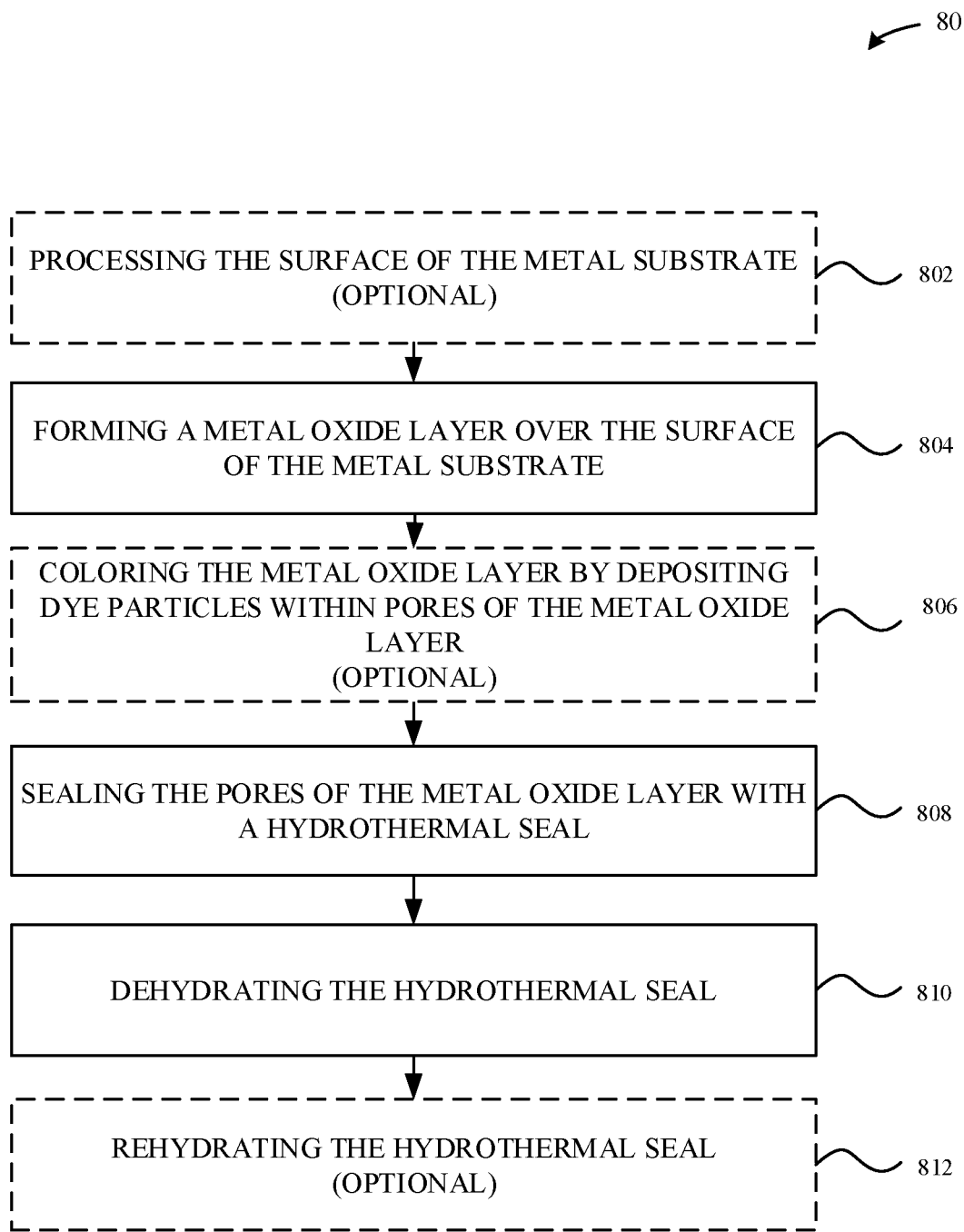
FIG. 8 illustrates a method for forming plugs in a metal part, in accordance with some embodiments.

FIG. 8 illustrates a method 800 for forming plugs in a metal part, in accordance with some embodiments. As illustrated in FIG. 8, the method 800 can optionally begin at step 802, where a surface of a part—e.g., a metal substrate 204—is optionally processed. In some examples, the surface of the metal substrate 204 is subject to a cleaning process, a texturizing process, or a polishing process. In particular, the texturizing process can be beneficial in providing a roughened external surface that can promote growth of the metal oxide layer 206 at those roughened regions.

At step 804, an anodization step is performed on the metal substrate 204. During the anodization process, a metal oxide layer 206 is formed from the metal substrate 204. In some examples, the metal oxide layer 206 may be formed through a thermal oxidation process or an electrolytic anodization process.

At step 806, the metal oxide layer 206 is optionally colored as a result of a dyeing process. During the dyeing process, the anodized part—e.g., the anodized part 210—is exposed to a dye solution bath. The anodized part 210 is submerged within the dye solution bath.

At step 808, the pore structures 212 of the anodized part 210 are sealed via a sealing process according to some embodiments to form the hydrothermally sealed part 230. In some instances, sealing the pore structures 212 may be preferable in that sealing closes the pore structures such that dye particles are retained within the metal oxide layer 206. In some examples, the pore structures 212 the aluminum oxide is hydrated during the sealing process. As a result, the aluminum oxide is converted to aluminum oxide hydroxide. Moreover, this process of hydrating the aluminum oxide hydrates the pore walls 216 of the pore structures 212, thereby increasing the structural integrity of the metal oxide layer 206.

At step 810, the hydrothermally sealed part 230 is exposed to a dehydration process, to form a dehydrated part 240. In some examples, the dehydration process includes subjecting the hydrothermally sealed part 230 to a sufficient amount of heat and/or vacuum pressure. During the dehydration process, the hydrated material (e.g., aluminum oxide hydroxide, etc.) is dehydrated to form $Al_2O_3$. The dehydrated material plugs the openings 218 of the pore structures 212.

At step 812, the dehydrated part 240 is optionally exposed to a rehydration process to form the rehydrated part 250.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An enclosure for a portable electronic device, the enclosure comprising:
   a metal substrate;
   a dehydrated a nodized layer overlaying the metal substrate, the dehydrated anodized layer comprising:
      an anodic oxidized portion having pores defined by openings that extend from an external surface of the anodic oxidized portion and toward the metal substrate; and
      a dehydrated portion comprising a metal oxide material that plugs the openings of the pores and is between about 0.5 wt % to about 10 wt % of the dehydrated anodized layer; and
   a hydrated moisture-impermeable barrier overlaying the dehydrated anodized layer.

2. The enclosure of claim 1, wherein the metal oxide material is between about 3 wt % to about 10 wt % of the dehydrated anodized layer.

3. The enclosure of claim 1, wherein the metal oxide material is bonded to pore walls that define the pores.

4. The enclosure of claim 3, wherein the dehydrated portion extends from the openings to bottom surfaces of the pores.

5. The enclosure of claim 3, wherein a concentration of metal oxide material decreases as a function of a distance from the external surface such that a region of the dehydrated anodized layer away from the external surface has a concentration of the metal oxide material that is less than a concentration of the metal oxide material at the external surface.

6. The enclosure of claim 1, wherein the pores further include dye particles disposed therein, and the dye particles impart the dehydrated anodized layer with an L* value of 40 or less as measured using a CIE L*a*b* color space when visible light is incident upon the external surface of the dehydrated anodized layer.

7. The enclosure of claim 6, wherein the dehydrated anodized layer has an external surface such as to minimize a light interference effect when the visible light is incident upon the external surface of the dehydrated anodized layer.

8. The enclosure of claim 1, wherein the metal substrate is an aluminum alloy and the metal oxide material is alumina ($Al_2O_3$).

9. The enclosure of claim 1, wherein the diffusion and/or moisture-impermeable barrier has a thickness between about 10 nanometers to about 30 nanometers.

10. The enclosure of claim 1, wherein the dehydrated portion is formed by an at least partial dehydration of hydrated material formed on the external surface and within the pores of the anodic oxidized portion by an at least partial hydrothermal sealing of the anodic oxidized portion; and
   wherein the hydrated moisture-impermeable barrier is formed upon rehydration of at least a portion of the dehydrated portion.

11. The enclosure of claim 10, wherein the at least partial dehydration comprises applying at least one of heat and vacuum pressure to the at least partially sealed anodic oxidized portion.

12. The enclosure of claim 10, wherein the moisture-impermeable barrier prevents and/or minimizes the diffusion of external contaminants in order to prevent the dehydrated portion from being dissolved.

13. The enclosure of claim 10, wherein the moisture-impermeable barrier prevents the flow of corrosion-causing ions through the anodic oxidized portion.

14. The enclosure of claim 10, wherein the metal substrate is an aluminum alloy, the hydrated material is boehmite (AlOOH) or bayerite ($Al(OH)_3$), and the metal oxide material is alumina ($Al_2O_3$).

15. The enclosure of claim 10, wherein, prior to the at least partial dehydration of hydrated material, the at least partially sealed anodic oxidized portion comprises about 25% to 45% by volume of boehmite or bayerite.

* * * * *